(12) United States Patent
Sun et al.

(10) Patent No.: US 8,518,791 B2
(45) Date of Patent: Aug. 27, 2013

(54) METHOD FOR FABRICATING A DAMASCENE SELF-ALIGNED FERROELECTRIC RANDOM ACCESS MEMORY (F-RAM) WITH SIMULTANEOUS FORMATION OF SIDEWALL FERROELECTRIC CAPACITORS

(75) Inventors: Shan Sun, Monument, CO (US);
Thomas E. Davenport, Denver, CO (US); John Cronin, Jericho, VT (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/569,755

(22) Filed: Aug. 8, 2012

(65) Prior Publication Data

US 2013/0037912 A1    Feb. 14, 2013

Related U.S. Application Data

(60) Provisional application No. 61/522,960, filed on Aug. 12, 2011.

(51) Int. Cl.
*H01L 21/20* (2006.01)
(52) U.S. Cl.
USPC ........... 438/387; 438/240; 438/242; 438/253; 438/382; 438/396; 257/300; 257/532; 257/E27.104; 257/E21.663
(58) Field of Classification Search
None
See application file for complete search history.

(56) References Cited

U.S. PATENT DOCUMENTS

| | | | |
|---|---|---|---|
| 4,888,733 A | 12/1989 | Mobley | |
| 4,914,627 A | 4/1990 | Eaton, Jr. et al. | |
| 5,394,367 A | 2/1995 | Downs et al. | |
| 5,864,932 A | 2/1999 | Evans et al. | |
| 5,920,453 A | 7/1999 | Evans et al. | |
| 5,990,513 A | 11/1999 | Perino et al. | |
| 6,027,947 A | 2/2000 | Evans et al. | |
| 6,150,184 A | 11/2000 | Evans et al. | |
| 6,174,735 B1 | 1/2001 | Evans | |
| 6,190,926 B1 | 2/2001 | Perino et al. | |
| 6,201,726 B1 | 3/2001 | Evans | |
| 6,211,542 B1 | 4/2001 | Eastep et al. | |
| 6,242,299 B1 | 6/2001 | Hickert | |
| 6,249,014 B1 | 6/2001 | Bailey | |
| 6,281,023 B2 | 8/2001 | Eastep et al. | |
| 6,358,755 B1 | 3/2002 | Evans | |
| 6,376,259 B1 | 4/2002 | Chu et al. | |
| 6,423,592 B1 | 7/2002 | Sun | |
| 6,492,673 B1 | 12/2002 | Fox et al. | |
| 6,495,413 B2 | 12/2002 | Sun et al. | |
| 6,597,028 B2 | 7/2003 | Fox et al. | |
| 6,613,586 B2 | 9/2003 | Bailey | |
| 2012/0040508 A1* | 2/2012 | Oh et al. | 438/382 |

* cited by examiner

*Primary Examiner* — Julio J Maldonado
*Assistant Examiner* — Joseph Galvin, III

(57) ABSTRACT

Disclosed is a non-volatile, ferroelectric random access memory (F-RAM) device and a method for fabricating the same in the form of a damascene self-aligned F-RAM device comprising a PZT capacitor built on the sidewalls of an oxide trench, while allowing for the simultaneous formation of two ferroelectric sidewall capacitors.

30 Claims, 30 Drawing Sheets

METHOD FOR FABRICATING A DAMASCENE SELF-ALIGNED FERROELECTRIC RANDOM ACCESS MEMORY (F-RAM) WITH SIMULTANEOUS FORMATION OF SIDEWALL FERROELECTRIC CAPACITORS

CROSS REFERENCE TO RELATED PATENT APPLICATIONS

The present application claims priority from U.S. Provisional Patent Application Ser. No. 61/522,960 filed Aug. 12, 2011, the disclosure of which is herein specifically incorporated by this reference in its entirety. The present invention is also related to the subject matter disclosed in U.S. patent application Ser. No. 13/569,735, filed Aug. 8, 2012, for "Method for Fabricating a Damascene Self-Aligned Ferroelectric Random Access Memory (F-RAM) Device Structure Employing Reduced Processing Steps" and U.S. patent application Ser. No. 13/569,785, filed Aug. 8, 2012, for "Method for Fabricating a Damascene Self-Aligned Ferroelectric Random Access Memory (F-RAM) Having a Ferroelectric Capacitor Aligned with a Three Dimensional Transistor Structure", the disclosures of which are also herein specifically incorporated by this reference in their entirety.

BACKGROUND OF THE INVENTION

The present invention relates, in general, to the field of integrated circuit (IC) memory devices. More particularly, the present invention relates to the field of non-volatile, ferroelectric random access memory (F-RAM) devices and a method for fabricating the same in the form of a damascene self-aligned F-RAM that allows for the simultaneous formation of two sidewall ferroelectric capacitors.

According to World Semiconductor Trade Statistics (WSTS), the semiconductor market reached an important milestone in 2010, posting worldwide revenues of more than $300 billion (in United States dollars) for the first time in the industry's history. In particular, the memory chip segment exhibited the highest growth rate during 2010, increasing from $45 billion in 2009 to $71 billion in 2010, representing a 57% year-over-year growth rate. Embedded memory devices represented more than 23% of the overall semiconductor market in 2010.

Within this context, the increasing demand for higher processing power is driving the semiconductor industry to develop memory devices with higher operational speeds in order to support the capabilities of modern electronic devices. F-RAM has emerged as a promising option for the industry, particularly in the market areas of mobile computing, smart meters, radio frequency identification (RFID) devices, office equipment and other applications requiring non-volatile data storage.

Standard dynamic random access memory (DRAM) and static random access memory (SRAM) devices, while providing relatively fast access times, are considered to be volatile memory devices inasmuch as data stored in such memories is lost when power is interrupted. In contrast, non-volatile memory devices are those that function to retain data despite any loss of power.

F-RAM devices are inherently non-volatile, meaning that these memory devices are able to retain stored data while the device is not powered. In comparison to electrically erasable programmable read only memory (EEPROM) FLASH memory devices, which are currently the most popular type of non-volatile memory, F-RAM devices have several advantages including lower power requirements (operational voltages of just 5V needed during read-write operations), higher read-write speeds (less than 70 nanoseconds), and virtually unlimited write endurance capability (more than 10,000,000,000 write cycles).

F-RAM memory devices may be fabricated based on the use of lead zirconium titanate (PZT) ferroelectric storage capacitors as memory elements integrated with complementary metal oxide semiconductor (CMOS) addressing, selection, and control logic. PLZT is a Lanthanum-doped form of PZT wherein some of the lead is replaced with lanthanum.

It is also known that PZT may also be doped with strontium and calcium to improve its ferroelectric dielectric properties. Ferroelectric storage capacitors having a strontium bismuth tantalate (SBT); barium strontium titanate (BST); and strontium titanate oxide (STO) dielectrics are also known in the art.

As used in the present application, the term "PZT" shall also be considered to include PLZT, SBT, BST, STO and other comparable ferrgelectric dielectric materials. Further, it should be noted that the techniques of the present invention disclosed herein are applicable to all known ferroelectric dielectrics including Perovskites and layered Perovskites (whether doped or undoped) including PZT, PLZT, BST, SBT, STO and others while simultaneously allowing for a potentially broader choice of electrode materials and the use of a forming gas anneal process step on the completed IC structure.

Regardless of the ferroelectric dielectric material employed, in operation F-RAM devices function through their ability to be polarized in one direction or another in order to store a binary value representative of a logic level "one" or "zero". The ferroelectric effect allows for the retention of a stable polarization state in the absence of an applied electric field due to the alignment of internal dipoles within the Perovskite crystals in the dielectric material. This alignment may be selectively achieved by application of an electric field which exceeds the coercive field of the material. Conversely, reversal of the applied field reverses the internal dipoles.

A hysteresis curve, wherein the abscissa and ordinate represent the applied voltage ("V") and resulting polarization ("Q") states respectively, may be plotted to represent the response of the polarization of a ferroelectric capacitor to the applied voltage. A more complete description of this characteristic hysteresis curve is disclosed, for example, in U.S. Pat. Nos. 4,914,627 and 4,888,733 assigned to Ramtron International Corporation, assignee of the present invention, the disclosures of which are herein specifically incorporated by this reference.

Representative of the current state of the art in F-RAM device fabrication is that disclosed in U.S. Pat. No. 6,150,184 for: "Method of Fabricating Partially or Completely Encapsulated Top Electrode of a Ferroelectric Capacitor," also assigned to Ramtron International Corporation. Therein described is the structure of a ferroelectric capacitor that includes a bottom electrode, a top electrode, an a ferroelectric layer located between the top and bottom electrodes that extends to completely encapsulate the top electrode, except for a contact hole to allow metallization of the top electrode. The total encapsulation of the top electrode reduces the sensitivity of the ferroelectric capacitor to hydrogen and thus improves electrical switching performance. The encapsulation technique can also be used to improve the performance of ferroelectric integrated circuits and other devices.

Further representative of the state of the art in the fabrication of F-RAM devices is that disclosed in U.S. Pat. No. 6,613,586 for: "Hydrogen Barrier Encapsulation Techniques for the Control of Hydrogen Induced Degradation of Ferroelectric Capacitors in Conjunction with Multilevel Metal Processing for Non-Volatile Integrated Circuit Memory Devices," also assigned to Ramtron International Corporation. Therein described is a device structure which ameliorates the hydrogen induced degradation of ferroelectric capacitors by completely encapsulating the capacitor within a suitable hydrogen barrier material, such as chemical vapor deposition ("CVD") or sputtered silicon nitride ($Si_3N_4$), thus ensuring process compatibility with industry standard process steps. Although the deposition process for CVD $Si_3N_4$ itself contains hydrogen, the deposition time may be kept relatively short thereby allowing the titanium nitride (TiN) local interconnect layer to act as a "short term" hydrogen barrier.

The disclosures of U.S. Pat. Nos. 6,150,184 and 6,613,586 are herein specifically incorporated by this reference in their entirety.

Despite the aforementioned advantages over volatile memory devices and other non-volatile technologies, F-RAMs currently account for a relatively small share of the non-volatile memory device market. Competitively, the main limitation of the F-RAM technology has been its lower storage density compared to FLASH devices coupled with higher manufacturing costs. These limitations stem primarily from the generally complex structure of current F-RAM devices which results in a manufacturing process that requires a high number of processing masks and etching steps.

As such, in order to be more competitive in the current memory device marketplace and be usable in a wider range of modern electronic devices, F-RAM devices need to be more highly integrated, implying increased storage densities and reduced manufacturing costs.

It would, therefore, be highly advantageous to simplify the structure of F-RAM devices with the purpose of improving storage density capabilities. It would also be highly advantageous to reduce the number of imaging materials and etching steps during F-RAM fabrication in order to reduce manufacturing costs.

SUMMARY OF THE INVENTION

Disclosed herein is a method for forming a damascene self-aligned ferroelectric RAM (F-RAM) device comprising two sidewall ferroelectric capacitors in an oxide trench coupled to contact studs at the bottom and top electrodes and isolated by a PZT layer. The fabrication method comprises the steps of forming, on a planar surface of a semiconductor substrate, three CVD tungsten, titanium/titanium nitride contact studs, followed by the deposition of an oxide layer which is etched based on the pattern established by a non-erodible mask, forming an opening for the F-RAM construction, deposition and etching of a titanium aluminum nitride conformal layer to form spacers, deposition and etching of a platinum bottom electrode layer, application of a photoresist material to form an image opening to etch the sidewalls of the oxide trench, followed by the deposition of a ferroelectric conformal layer ideally doped with lead zirconium titanate (PZT) and deposition and etching of a platinum top electrode layer on top, followed by the formation of three CVD tungsten, titanium/titanium nitride contact studs, two of them above each of the sidewall capacitors, and application of chemical mechanical polishing (CMP) to planarize the surface of the F-RAM structure. Efficiency is enhanced by the formation of a third contact stud using the same conformal metal deposition of the fundamental deposition layer.

Also further disclosed herein is a method for forming a semiconductor device on a substrate having at least two contact studs formed in a planar surface thereof comprising forming an insulating layer overlying the planar surface and selectively removing a portion of the insulating layer and a selected portion of the planar surface to form an opening extending to and partially between the at least two contact studs. First spacers are formed adjoining sides of the opening over the at least two contact studs and bottom electrode spacers are formed, each contacting respective ones of the at least two contact studs in the opening adjoining the first spacers. An insulating cap is formed in the opening between the at least two contact studs and the bottom electrode spacers and a ferroelectric dielectric layer is formed in the opening over the insulating layer, the insulating cap and between the bottom electrode spacers. A pair of top electrodes are formed within the opening comprising first and second side portions displaced laterally from respective ones of the bottom electrode spacers by the ferroelectric dielectric layer. An additional insulating layer is formed between the top electrodes and over the ferroelectric dielectric layer and first and second contacts to each of the top electrodes are formed within the additional insulating layer.

Still further disclosed herein is a method for forming a ferroelectric device comprising forming first and second contact studs in a planar surface of a substrate and depositing an oxide layer on the planar surface. The oxide layer is selectively etched to form an opening through the oxide layer to first and second contact studs and an over-etched region therebetween and a titanium aluminum nitride layer is deposited over the oxide layer and within the opening and over-etched region. Portions of the aluminum nitride layer are selectively removed except for sidewalls of the opening adjoining the first and second contact studs to produce first spacers and a noble metal layer is deposited within the opening. The noble metal layer is selectively removed over the first and second contact studs and within the over-etched region to produce bottom electrode spacers medially of the first spacers and an additional oxide layer is deposited within the opening. The additional oxide layer is selectively removed to produce a trench cap in a lower portion of the opening and within the over-etched region and a ferroelectric dielectric layer is deposited over the oxide layer, the trench cap and medial and distal portions of the first and bottom electrode spacers within the opening. An additional noble metal layer is deposited over the ferroelectric dielectric layer and selectively removed to form a pair of top electrodes within the opening and displaced from the bottom electrode spacers by the ferroelectric dielectric layer. An additional oxide layer is deposited over the ferroelectric dielectric layer and between the top electrodes and selectively etched to form first and second openings to corresponding top portions of the pair of top electrodes. Electrical contacts are formed to the first and second end portions through the first and second openings.

Additionally disclosed herein is a ferroelectric device which comprises first and second contact studs formed upon a semiconductor substrate and a trench cap extending between the first and second contact studs at a planar surface of the substrate. First spacers contact each of the first and second contact studs and extend distally therefrom. Bottom electrode spacers contact each of the first and second contact studs and extend distally therefrom, medially adjoining the first spacers. A ferroelectric layer overlies the trench cap and the bottom electrode spacers. A pair of top electrodes are disposed within the ferroelectric layer over the trench cap and medially of the bottom electrode spacers displaced by the ferroelectric layer. First and second electrical contacts are coupled to distal end portions of the pair of top electrodes.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

The present invention presents a novel, non-volatile, ferroelectric random access memory (F-RAM) device and a method for fabricating the same in the form of a damascene self-aligned F-RAM device comprising a PZT capacitor built on the sidewalls of an oxide trench, while allowing for the simultaneous formation of two ferroelectric sidewall capacitors.

A representative method in accordance with the present invention comprises the processing steps disclosed in FIGS. 1 through 30 inclusive.

Figure 1:
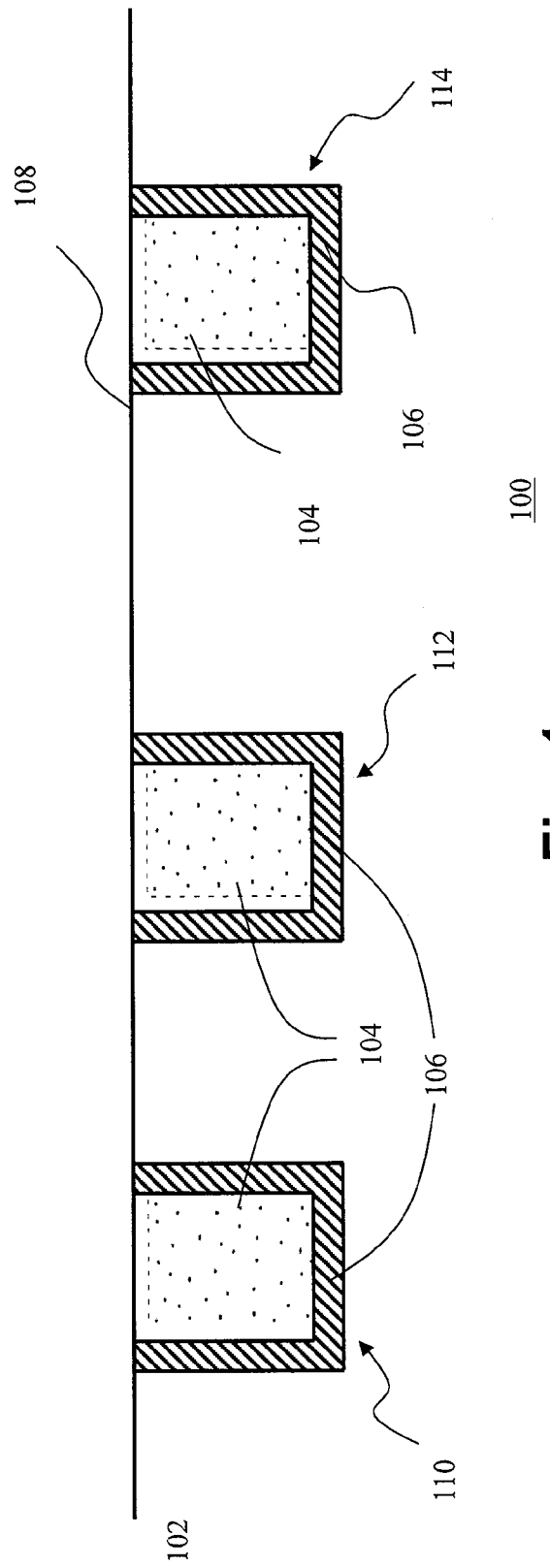
FIG. 1 is a partial, cross-sectional illustration of the structure of an F-RAM substrate, which provides a depiction of the first-level F-RAM substrate with contact studs.

With reference now to FIG. 1, the structure of an F-RAM substrate 100 is shown and provides a depiction of the first-level F-RAM substrate with three contact studs. A layer of BSPG 102 (boron phosphorus silicon glass) is deposited and planarized onto a silicon or other substrate (not shown in FIG. 1). Any oxide, nitride, or other appropriate dielectric can be substituted for the BPSG 102 layer. In the BPSG 102 layer, a non-erodible mask (such as $AL_2O_3$ or $Si_3N_4$, not shown in FIG. 1) is employed to reactive-ion etch (RIE) and form contact holes A, B, and C (not shown in FIG. 1). After removing the non-erodible mask, Ti/TiN 106 (titanium/titanium nitride) liners and CVD (chemical vapor deposition) tungsten (W) 104 are deposited. A chemical mechanical polishing (CMP) operation is then used to planarize back the CVD Tungsten 104 and Ti/TiN 106 to the level of the planar surface 108 of BPSG 102 layer to form contact stud A 110, contact stud B 112, and contact stud C 114.

Figure 2:
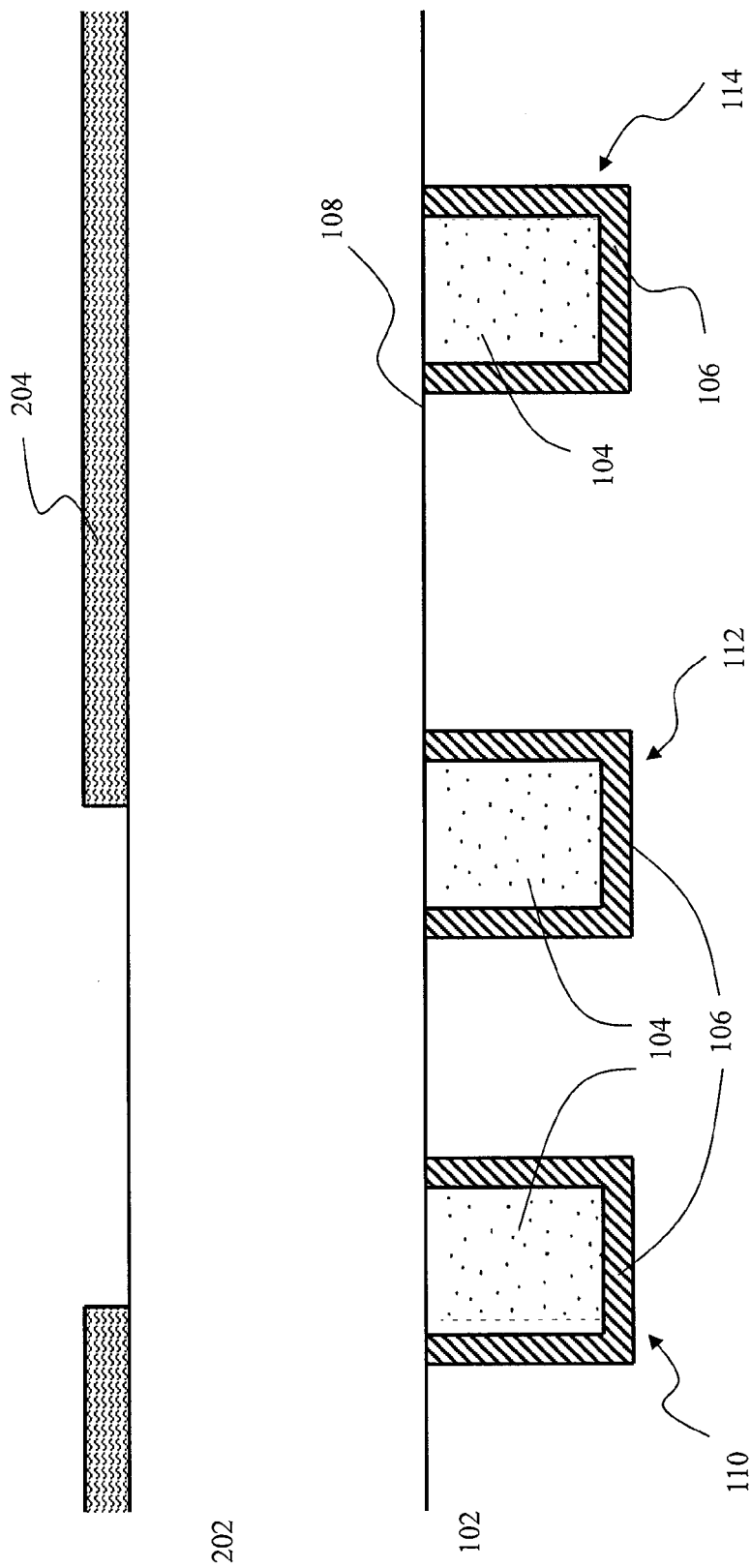
FIG. 2 is a follow-on view which illustrates the non-erodible mask structure.

With reference additionally now to FIG. 2, a non-erodible mask structure 200 is illustrated depicting the chemical vapor deposition (CVD) of a planarized oxide 202 layer over the top of the F-RAM substrate 100. The oxide 202 layer is planar as it is deposited over the planarized surface of BSPG 102. A non-erodible mask 204 (such as $AL_2O_3$ or $Si_3N_4$) is subsequently applied over contact stud C 114 and is defined over portions of contact stud B 112 and contact stud A 110. Masking is performed by defining the mask layer over the oxide 202 layer and then using photoresist to define the desired pattern.

Photoresist is a light sensitive material that when exposed to light forms a defined pattern on the non-erodible mask 204 as shown in FIG. 2. When the non-erodible mask 204 is etched and the photoresist removed in an O2 plasma ash, it leaves an exposed surface on the oxide 202 layer. The non-erodible mask 204 can be made of different materials such as aluminum oxide ($Al_2O_3$), silicon nitride ($Si_3N_4$), and other metals such as aluminum. As such, the process disclosed herein allows for the use of different types of non-erodible mask materials.

Figure 3:
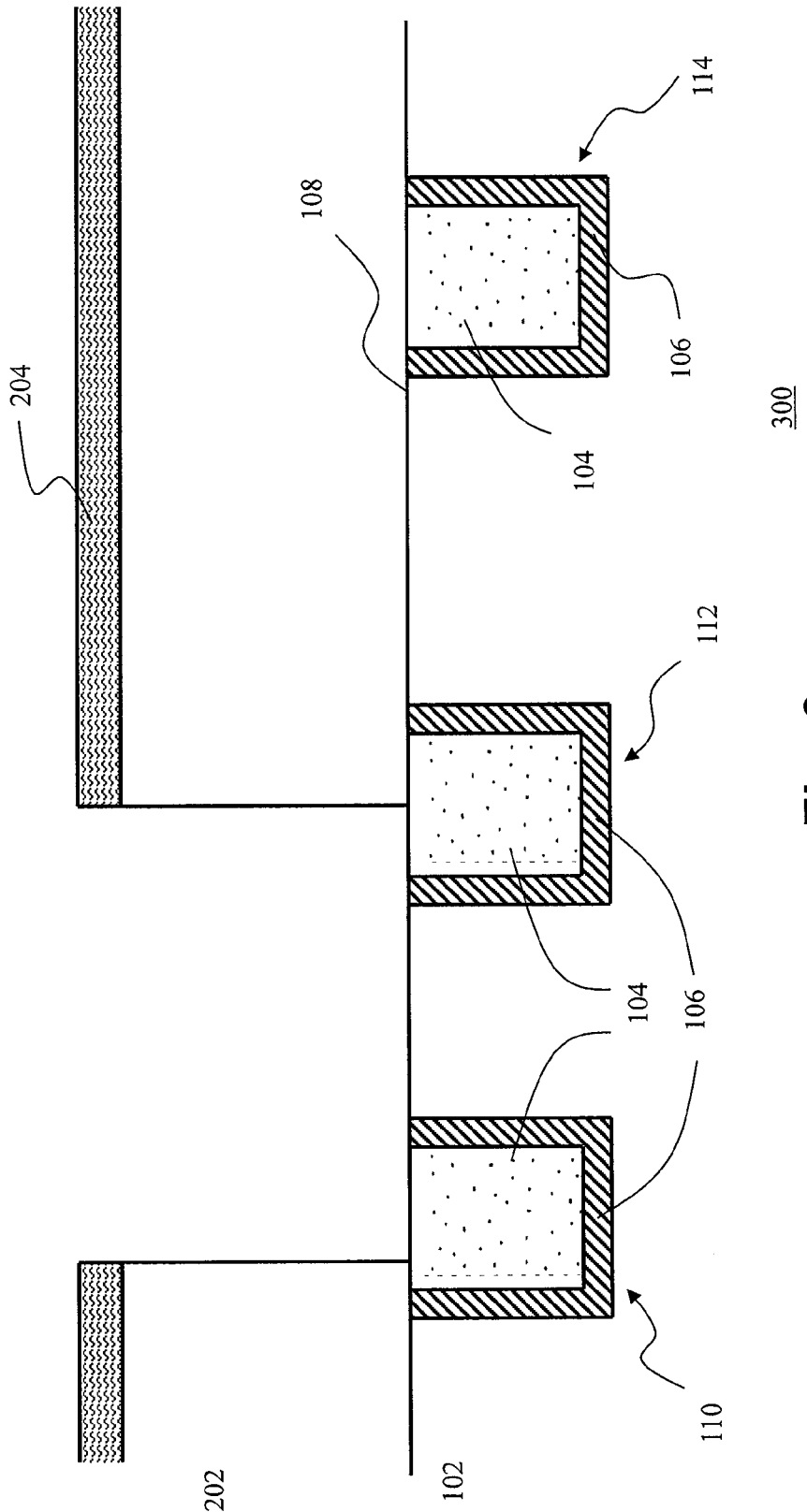
FIG. 3 is a follow-on view which illustrates the over-etched region structure.

With reference additionally now to FIG. 3, the structure of the over-etched region structure 300 is shown. In FIG. 3, the exposed surface of the oxide 202 layer in the non-erodible mask structure 200 is then etched down to the planar surface 108 with a reactive-ion etching (RIE) process using, for example, $CF_4$ in oxygen.

Figure 4:
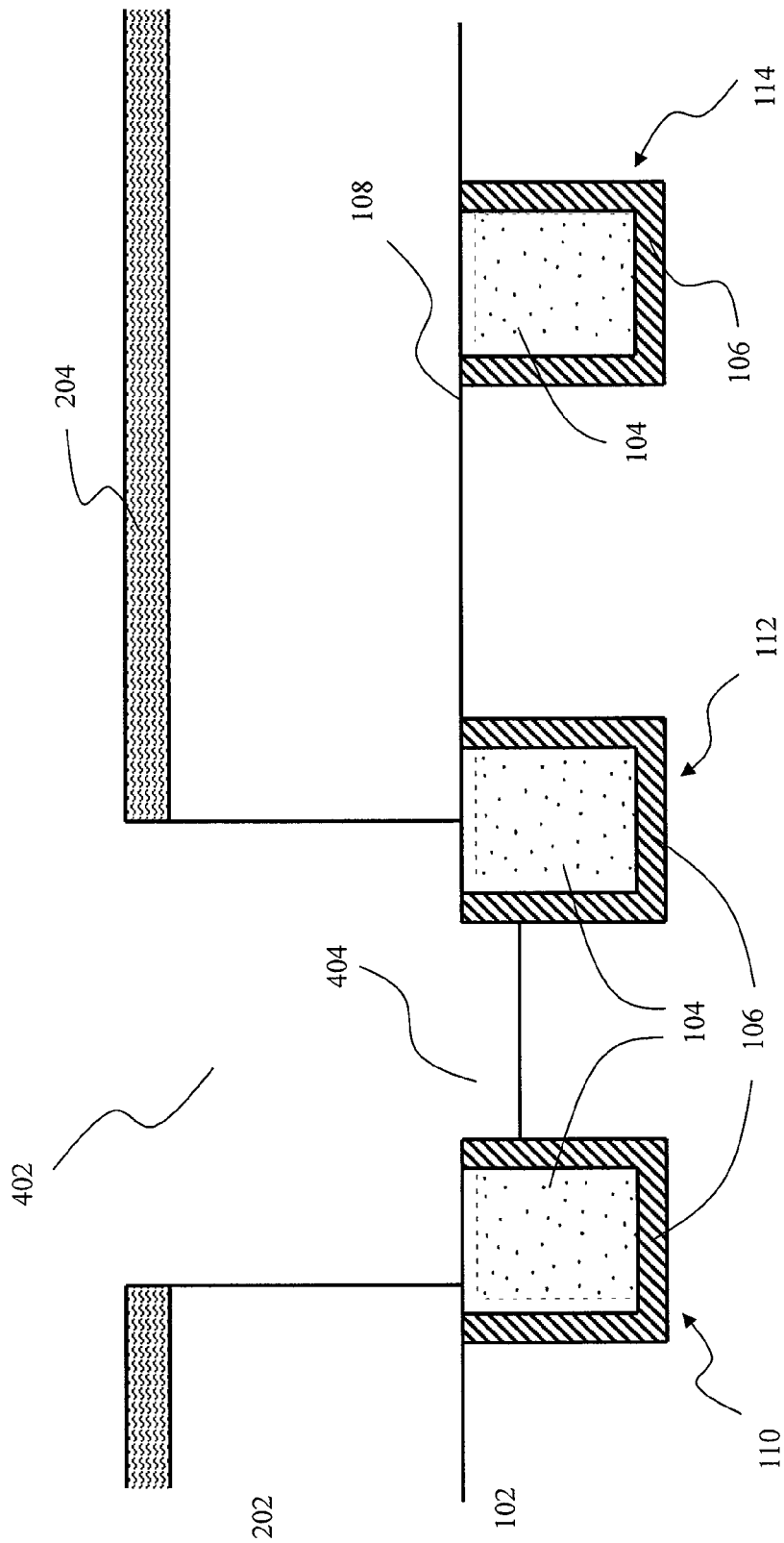
FIG. 4 is a follow-on view which illustrates the structure of the F-RAM opening after the non-erodible mask is removed.

With reference additionally now to FIG. 4, the F-RAM opening structure 400 is shown. In FIG. 4, the reactive-ion etching process continues down to the level of an over-etch required across the wafer, whereby over-etched region 404 is formed below the planar surface 108. The etching process on oxide 202 in FIG. 4 results in F-RAM opening 402.

Figure 5:
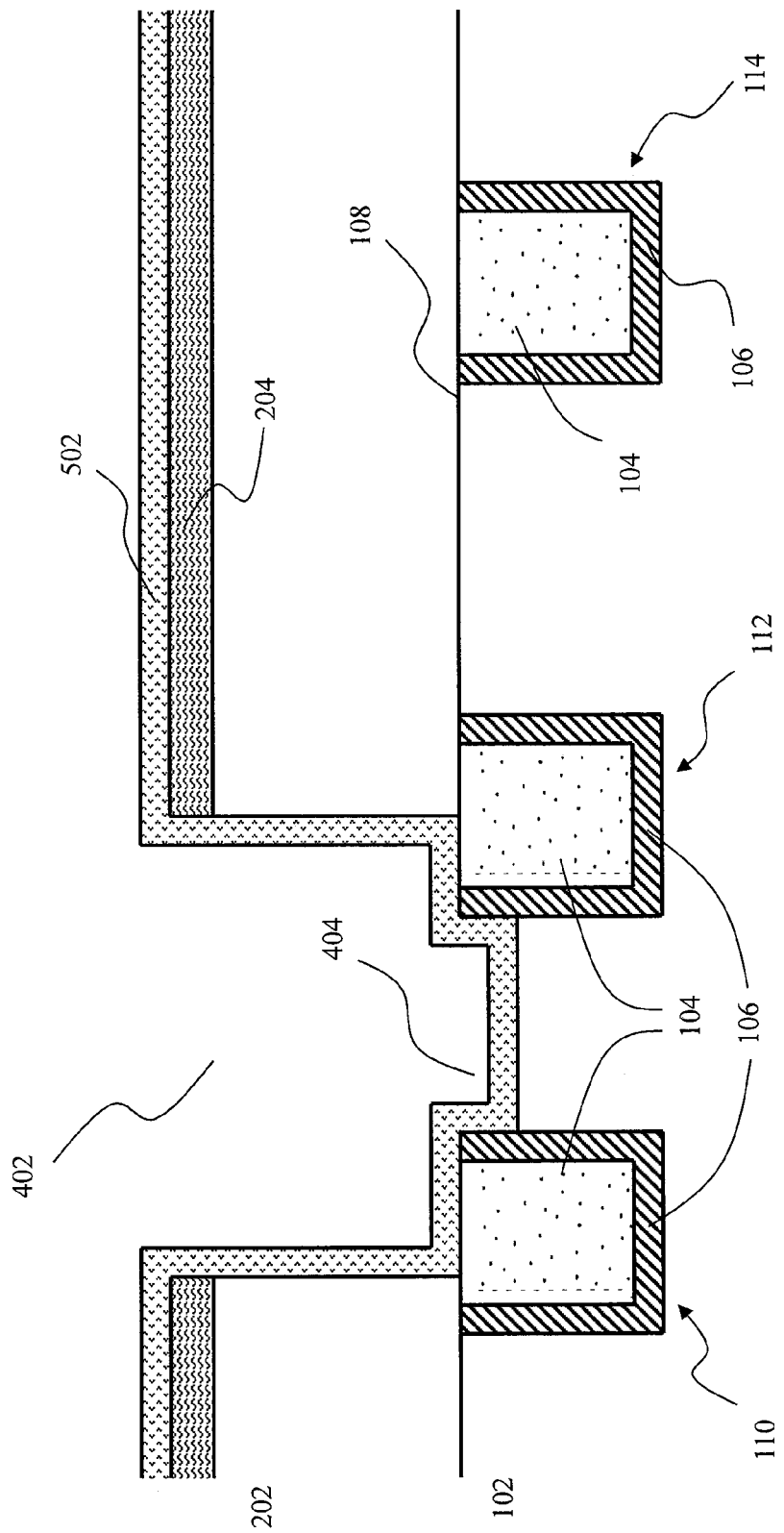
FIG. 5 is a follow-on view which illustrates the conformal CVD titanium aluminum nitride structure.

With reference additionally now to FIG. 5, the CVD titanium aluminum nitride structure 500 is shown. In FIG. 5, a layer of about 1000 angstroms of titanium aluminum nitride film is subsequently deposited by a CVD system over the F-RAM opening structure 400, forming a conformal titanium aluminum nitride 502 layer on the top of the oxide 202 layer and on the sides and bottom of the F-RAM opening 402. Titanium tetrachloride ($TiCl_4$), dimethylethylamine alane (DMEAA) and ammonia gas may be used as source gases for the CVD of titanium aluminum nitride.

Figure 6:
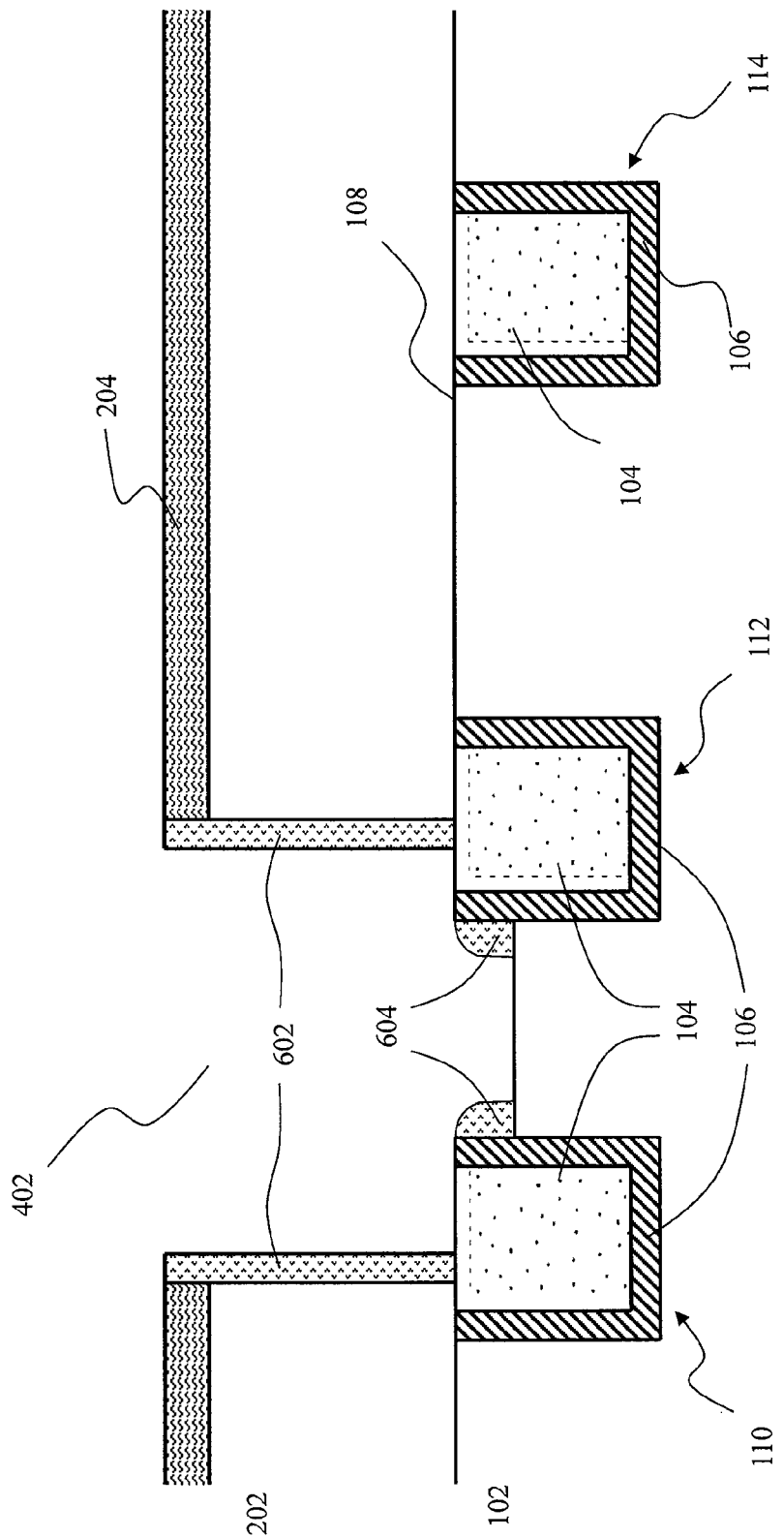
FIG. 6 is a follow-on view which illustrates the F-RAM structure with titanium aluminum nitride spacers.

With reference additionally now to FIG. 6, the removal of a portion of the titanium aluminum nitride conformal layer creating F-RAM structure with titanium aluminum nitride spacers 600 is depicted. In FIG. 6, a portion of the conformal titanium aluminum nitride 502 layer is removed from the top and bottom of the oxide 202 layer using a reactive-ion etch technique. This etching process forms the titanium aluminum nitride spacers 602 on the sides of the F-RAM opening 402. This particular step, however, also produces titanium aluminum nitride stringers 604 in the bottom of the over-etched region 404.

Figure 7:
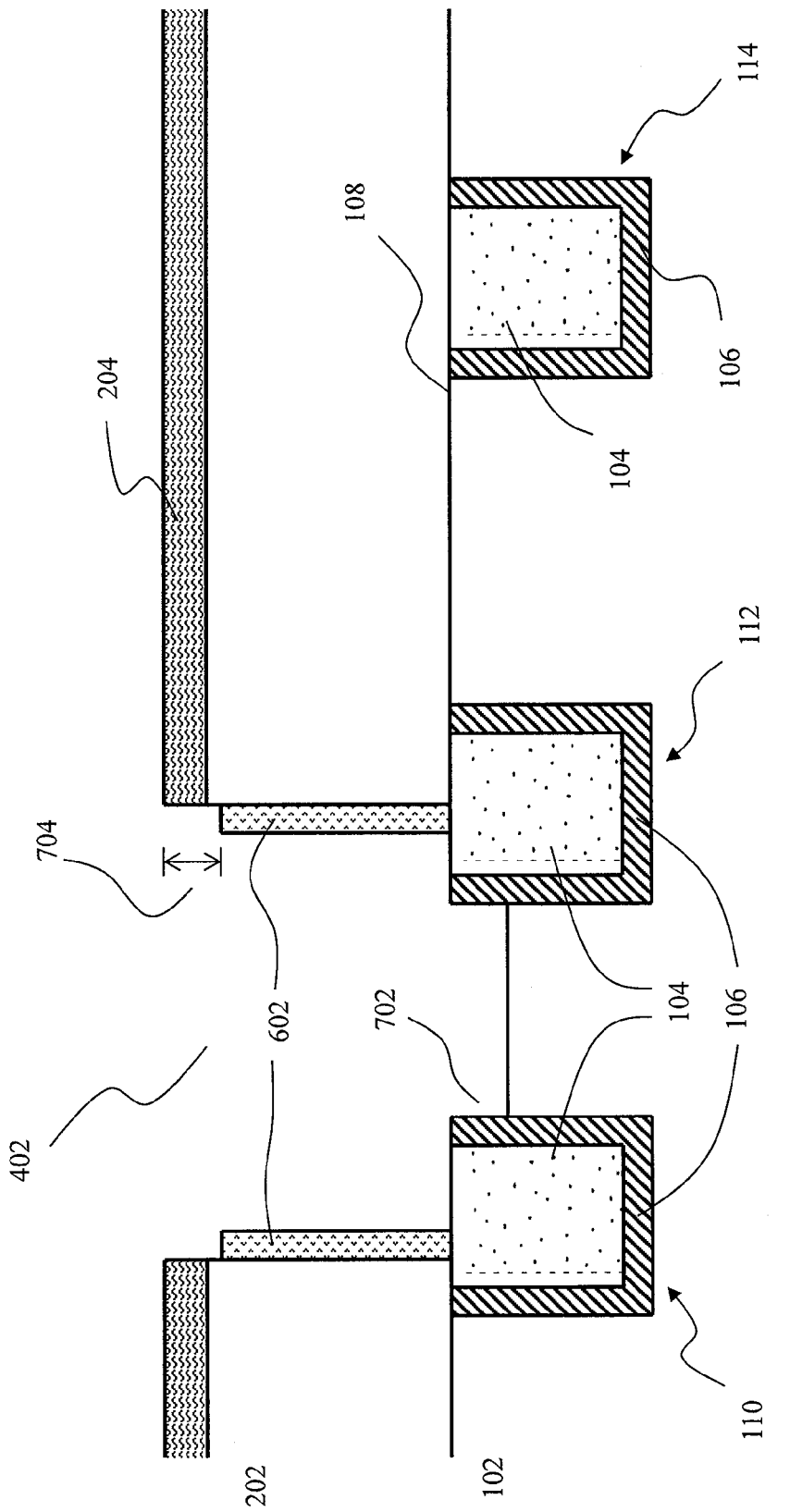
FIG. 7 is a follow-on view which illustrates the F-RAM structure with etched titanium aluminum nitride spacers.

With reference additionally now to FIG. 7, the etching of a portion of the titanium aluminum nitride spacers to create F-RAM structure with etched titanium aluminum nitride spacers 700 is depicted. Following the process in FIG. 7, reactive-ion etching continues in order to accomplish the removal of the titanium aluminum nitride stringers 604, producing string clearing 702 region in the bottom of the over-etched region 404. This reactive-ion etch step also removes a small portion from the top of the titanium aluminum nitride spacers 602, forming over-etched region 704.

Figure 8:
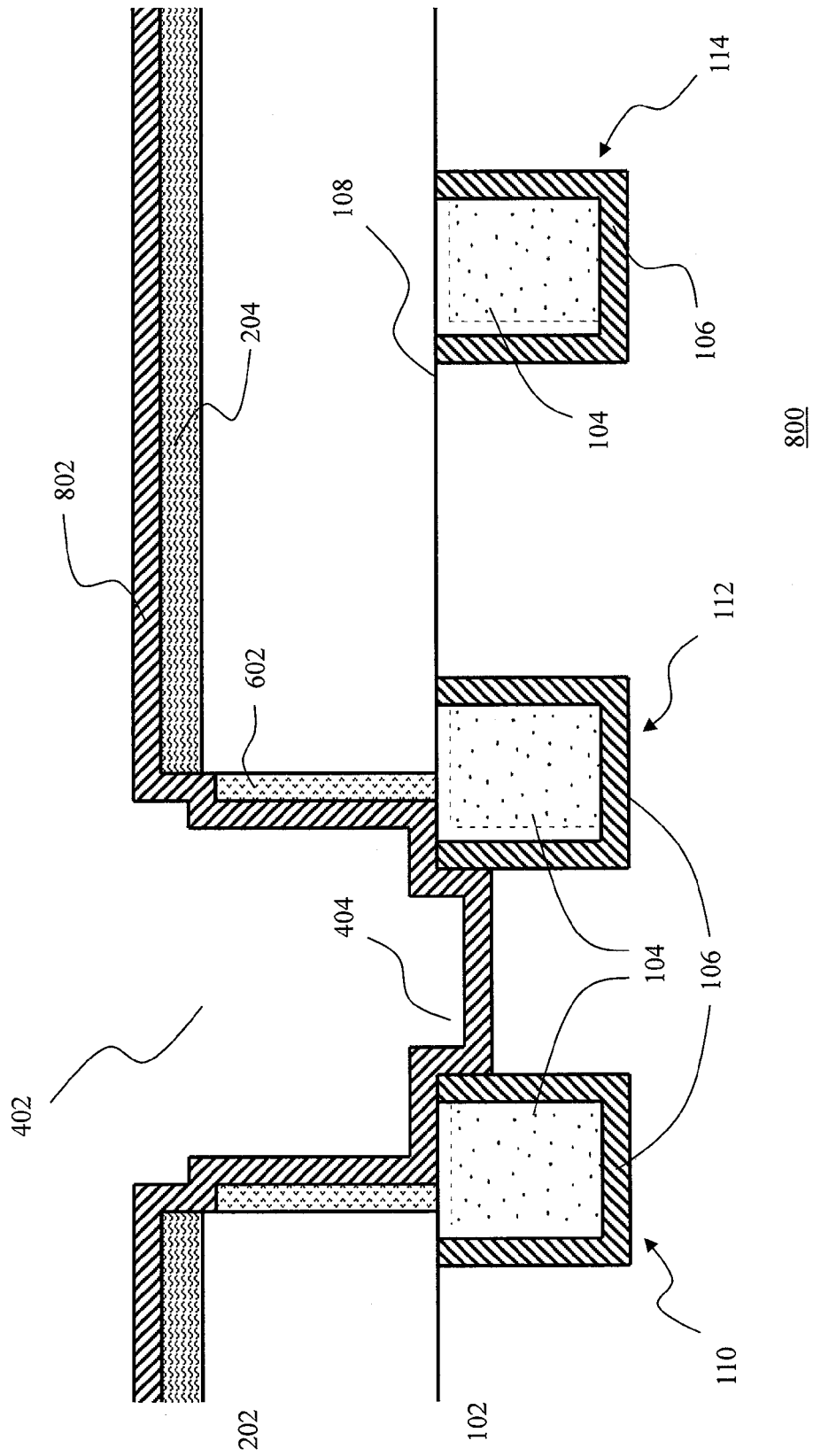
FIG. 8 is a follow-on view which illustrates the platinum structure.

With reference additionally now to FIG. 8, the formation of F-RAM platinum structure 800 is shown. In FIG. 8, a conformal layer of platinum of about 500 to 1000 angstroms is deposited by chemical vapor deposition over the top of the F-RAM structure with etched titanium aluminum nitride spacers 700, forming the platinum 802 bottom electrode layer. This platinum 802 bottom electrode layer covers the top and bottom of the oxide 202 layer and sidewalls of the titanium aluminum nitride spacers 602. While platinum is used for the bottom electrode (BE) layer, other known materials compatible with ferroelectric films could also be used, including, for example, iridium (Ir) and iridium oxide (IrOx), palladium (Pd) and palladium oxide (PdOx), ruthenium (Ru) and ruthenium oxide (RuOx), rhodium (Rh) and rhodium oxide (RhOx).

Figure 9:
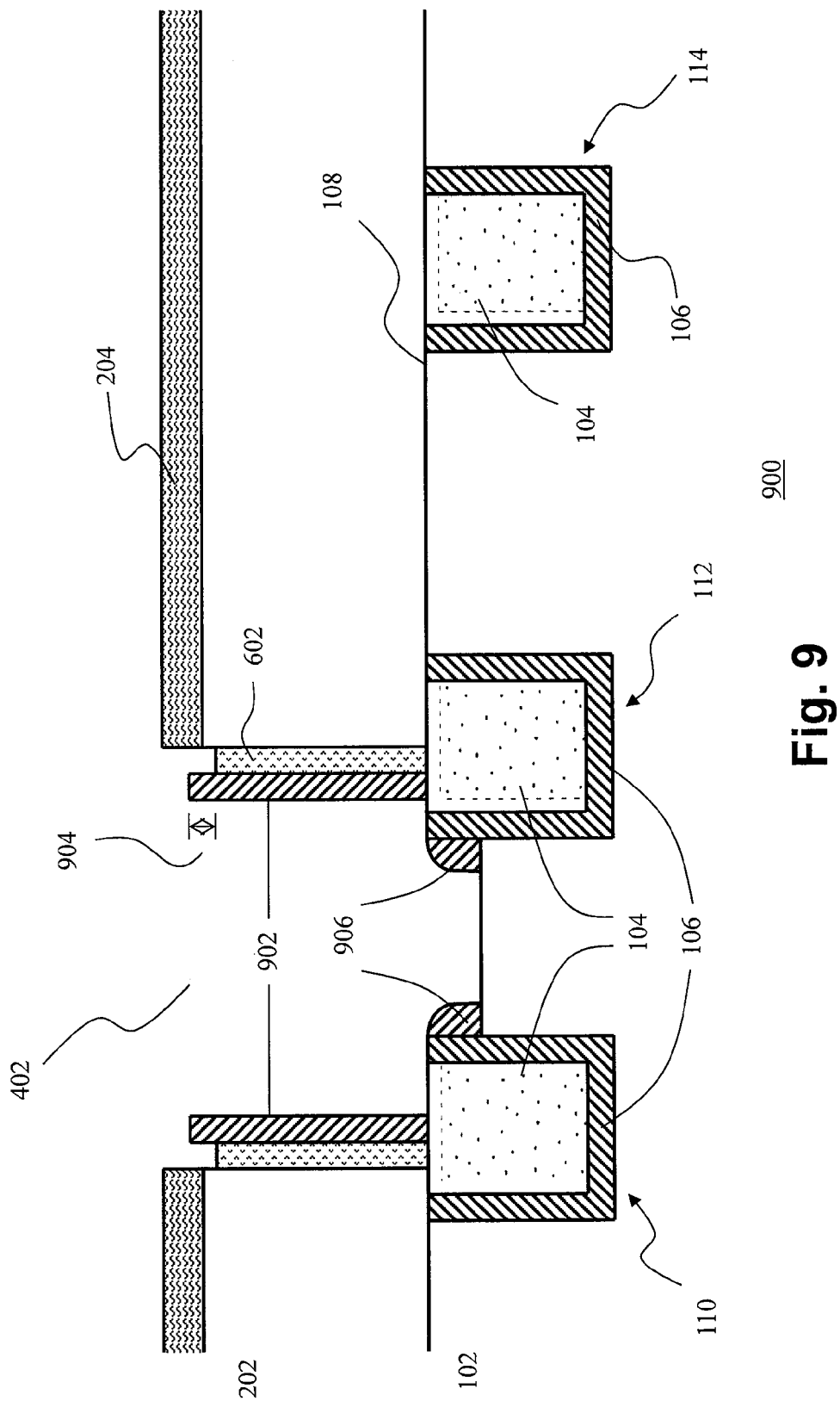
FIG. 9 is a follow-on view which illustrates the F-RAM structure with platinum BE spacers.

With reference additionally now to FIG. 9, the removal of a portion of the platinum 802 bottom electrode (BE) layer in the F-RAM platinum structure 800 is shown creating F-RAM structure with platinum BE spacers 900. In FIG. 9, the platinum 802 BE layer is etched away from the top and bottom of the oxide 202 layer, using a reactive-ion etch process, forming platinum BE spacers 902. Note that in this process step, the platinum BE spacers 902 are etched below the level of the oxide 202 layer, but not to the same height as the titanium aluminum nitride spacers 602, creating an excess of material 904 on top of the platinum BE spacers 902. Platinum is typically etched using a reactive-ion etch using, although other gases may be used. Ion milling can be used as well as an alternative etching technique. As illustrated in FIG. 9, the etching of the platinum 802 BE layer creates platinum stringers 906 in the over-etched region 404.

Figure 10:
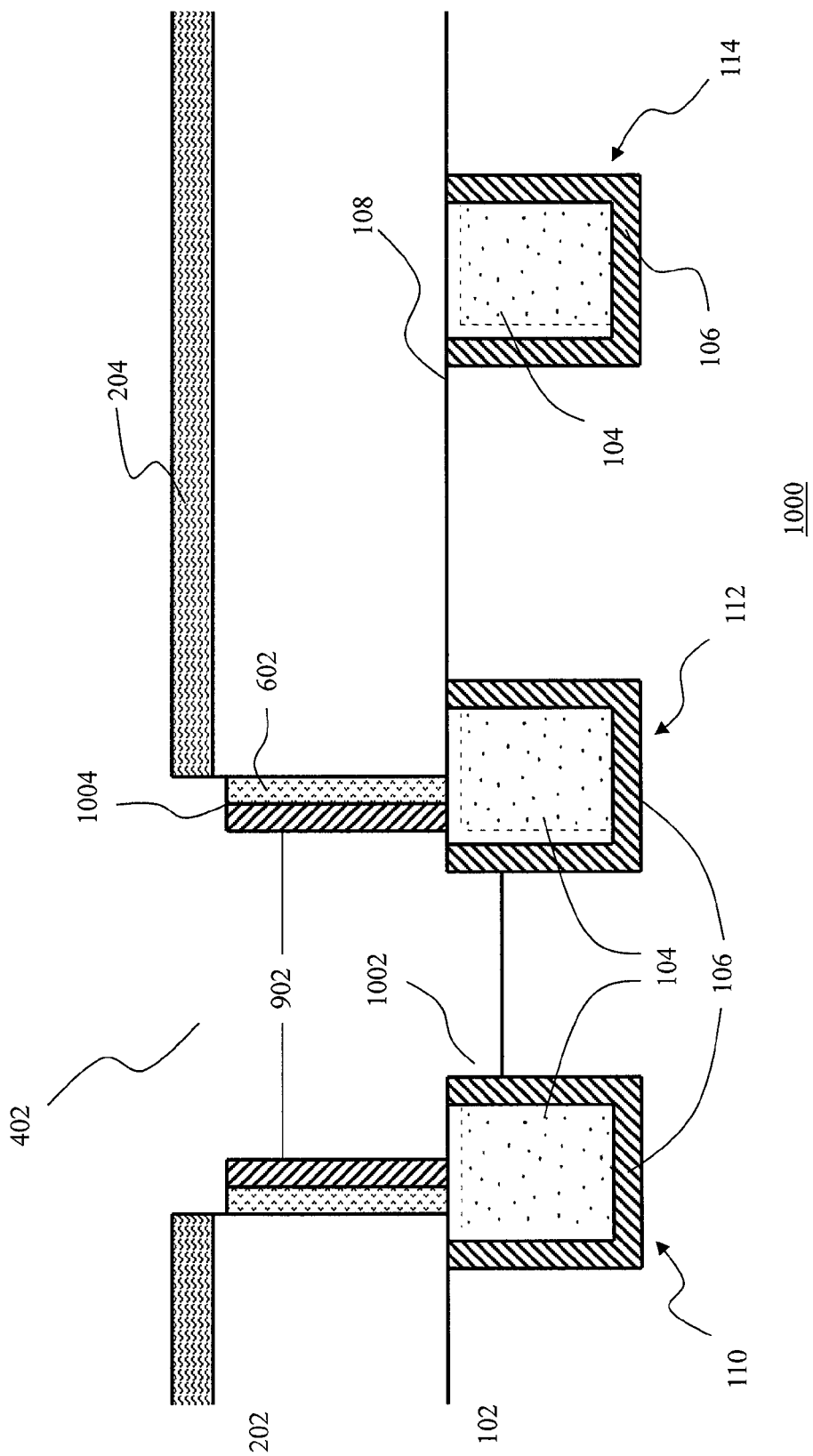
FIG. 10 is a follow-on view which illustrates the F-RAM structure after the etching of the platinum BE spacers.

With reference additionally now to FIG. 10, the etching of a portion of the platinum BE spacer layer to create F-RAM structure 1000 is illustrated. In FIG. 10, the application of reactive-ion etch continues in order to accomplish the removal of the platinum stringers 906, creating string clearing 1002 in the bottom of the over-etched region 404. This reactive-ion etching step also removes the excess of material 904 from the top of the platinum BE spacers 902, creating a level surface 1004 out of the platinum BE spacers 902 layer and the titanium aluminum nitride spacers 602 layer.

Figure 11:
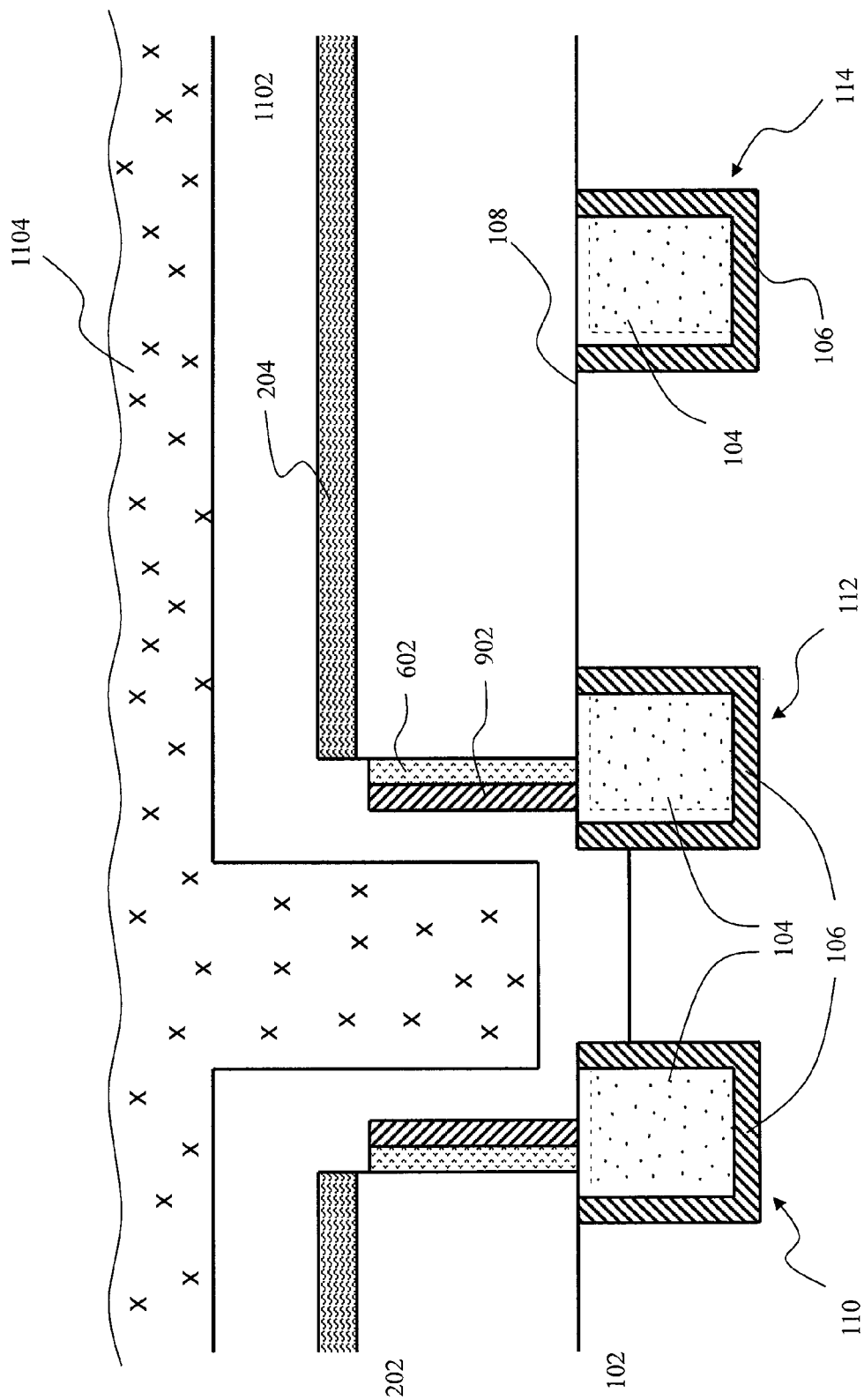
FIG. 11 is a follow-on view which illustrates the photoresist application structure.

With reference additionally now to FIG. 11, the application of a CVD oxide layer and a photoresist material on the top F-RAM structure 1000 is depicted, forming photoresist application structure 1100. In FIG. 11, a conformal oxide 1102 layer is deposited using a CVD process over the top of the F-RAM structure 1000. A photoresist 1104 material is subsequently spun applied over the top of the oxide 1102 layer, filling the F-RAM opening 402 (FIG. 4).

Figure 12:
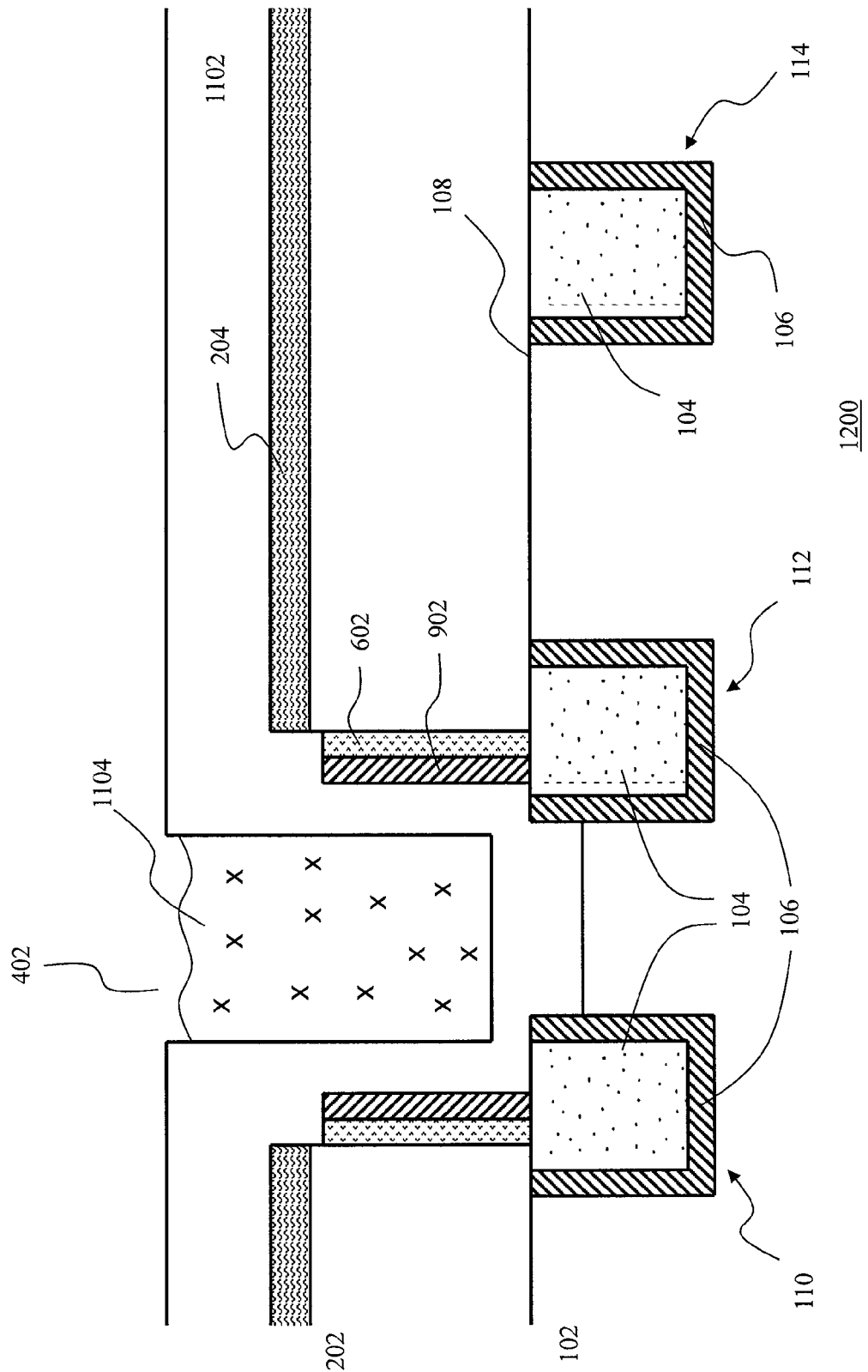
FIG. 12 is a follow-on view which illustrates the etched photoresist structure.

With reference additionally now to FIG. 12, the removal of the photoresist material in photoresist application structure 1100 is shown, creating etched photoresist structure 1200. In FIG. 12, a portion of the photoresist 1104 material is etched away using a plasma oxygen ($O_2$) plasma ash in order to shape a structure below the surface of the oxide 1102 layer, leaving the photoresist 1104 material in the F-RAM opening 402.

Figure 13:
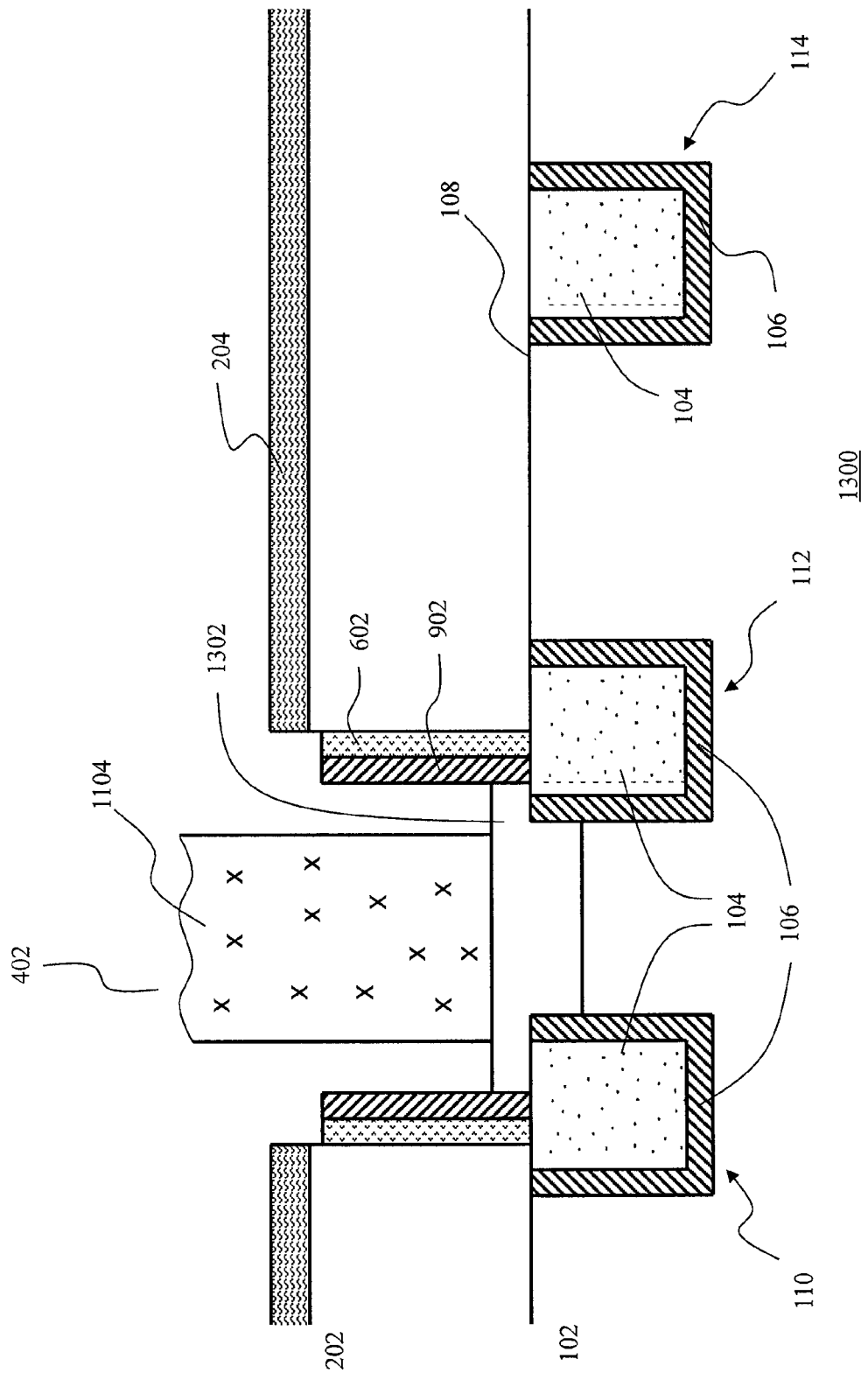
FIG. 13 is a follow-on view which illustrates the trench cap structure.

With reference additionally now to FIG. 13, the removal of a portion of the oxide 1102 layer in the etched photoresist structure 1200 is shown to create trench cap structure 1300. In FIG. 13, the oxide 1102 layer is reactive-ion etched down to the base of the photoresist 1104 material, by means of a timed etch, forming a trench cap 1302 composed of the remaining oxide 1102 layer.

Figure 14:
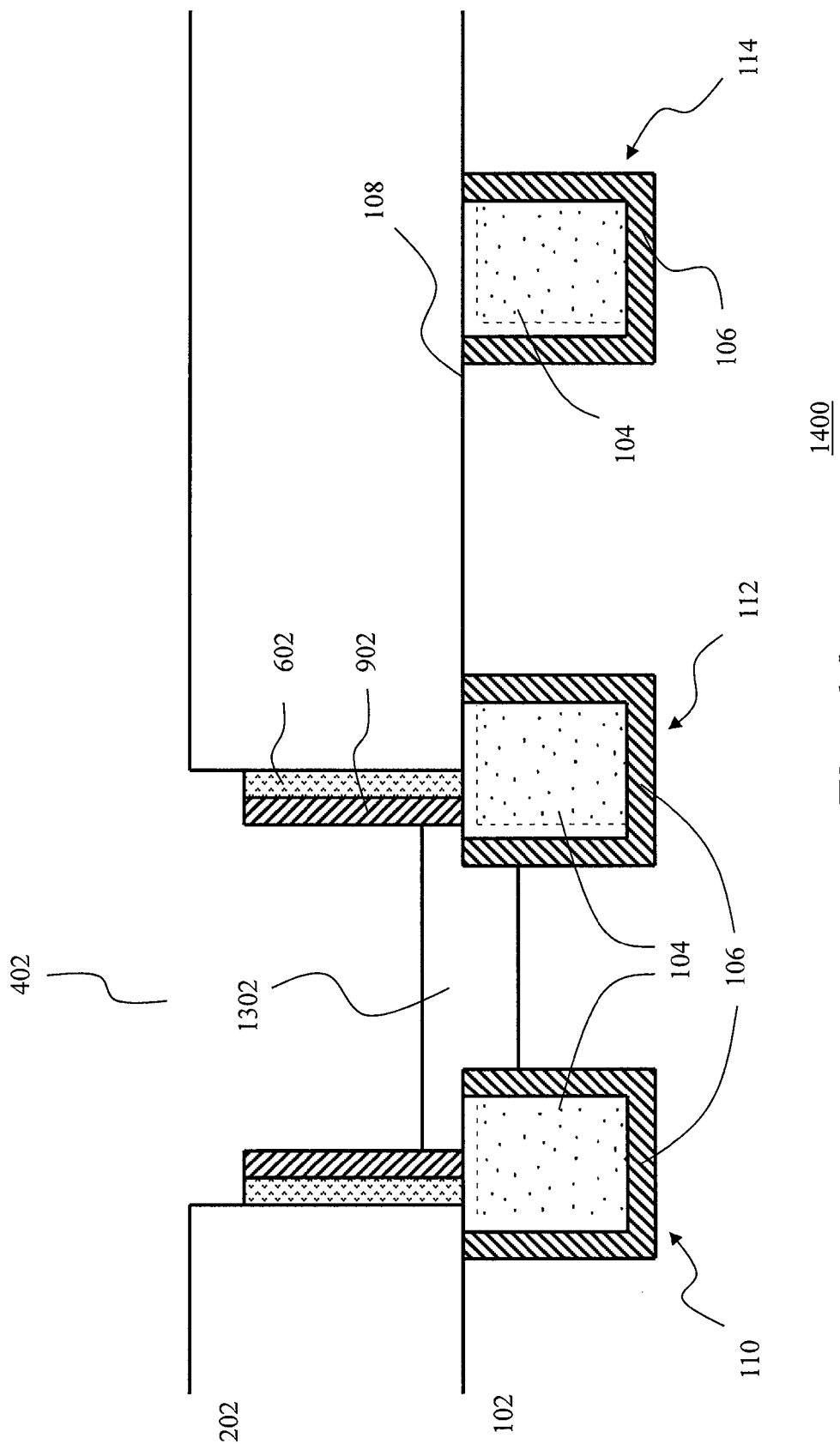
FIG. 14 is a follow-on view which illustrates the exposed trench cap structure.

With reference additionally now to FIG. 14, the removal of the remainder of the photoresist material in the trench cap structure 1300 is shown, forming the exposed trench cap structure 1400. In FIG. 14, the photoresist 1104 material is completely removed by the same $O_2$ plasma ash process described above, exposing the trench cap 1302 surface. Note that the trench cap 1302 (composed of oxide) completely fills the over-etched region 404. In addition, the non-erodible mask 204 is removed by employing an ion etch chemistry, specific to the type of materials used in the non-erodible mask itself. For example, if the non-erodible mask is made of $Si_3N_4$, it may be etched by a $Si_3N_4$ chemistry that will not affect the oxide 202 layer.

Figure 15:
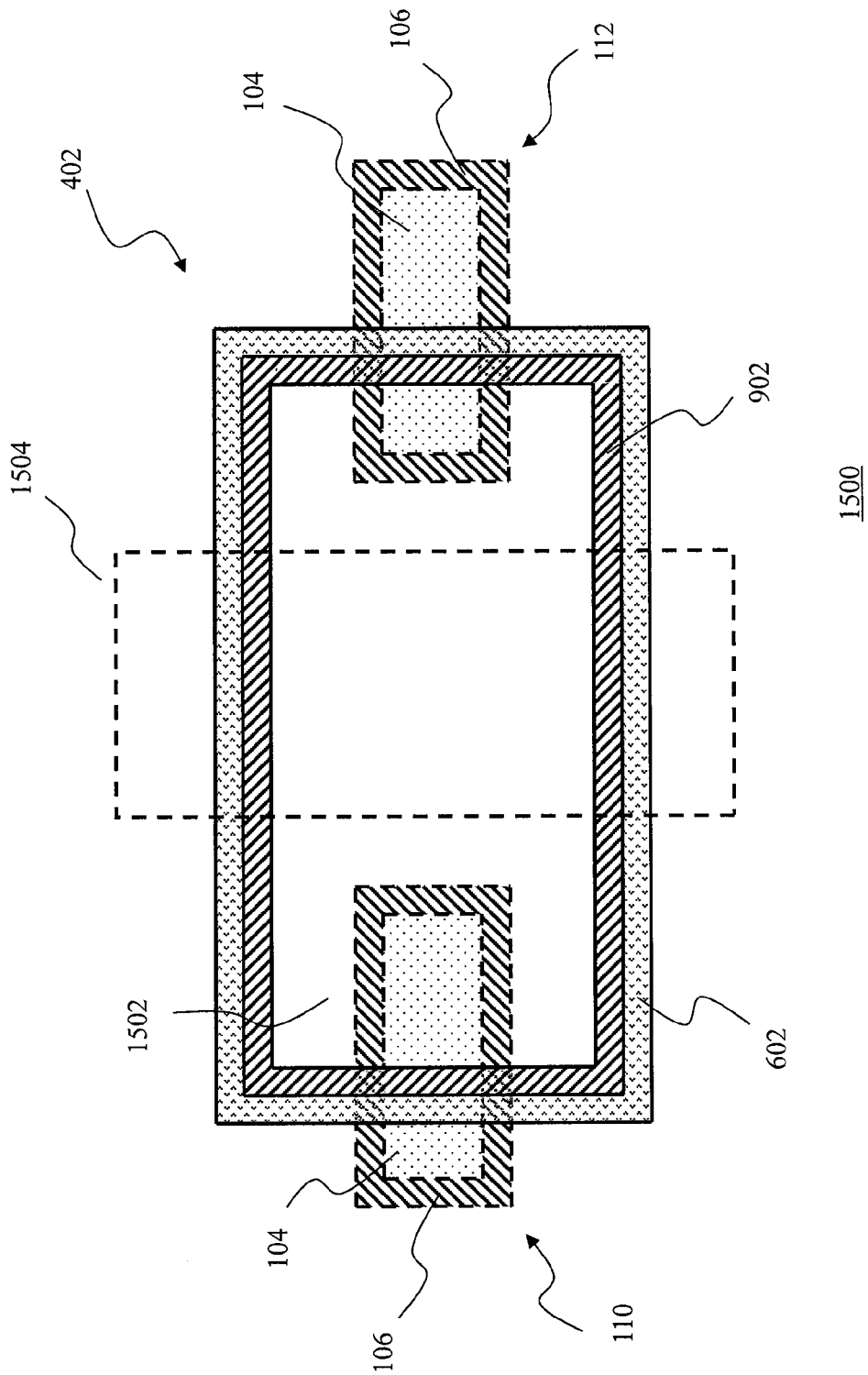
FIG. 15 is a partial top plan view which illustrates the F-RAM opening structure after the deposition of titanium aluminum nitride spacers and bottom electrode layer.

With reference additionally now to FIG. 15, a top plan view of the F-RAM opening structure 1500 is shown. From a top view perspective, FIG. 15 illustrates contact stud A 110 on the left and contact stud B 112 on the right of the F-RAM opening 402. FIG. 15 also depicts the Ti/TiN 106 liners in contact stud A 110 and contact stud B 112, and the CVD tungsten 104 filling both contact stud A 110 and contact stud B 112. Notice also in FIG. 15, the titanium aluminum nitride spacers 602 and platinum BE spacers 902 are around the sidewalls of the F-RAM opening 402. On top of the F-RAM opening 402 structure, a photoresist 1502 material is applied and then imaged to form image opening 1504.

Figure 16:
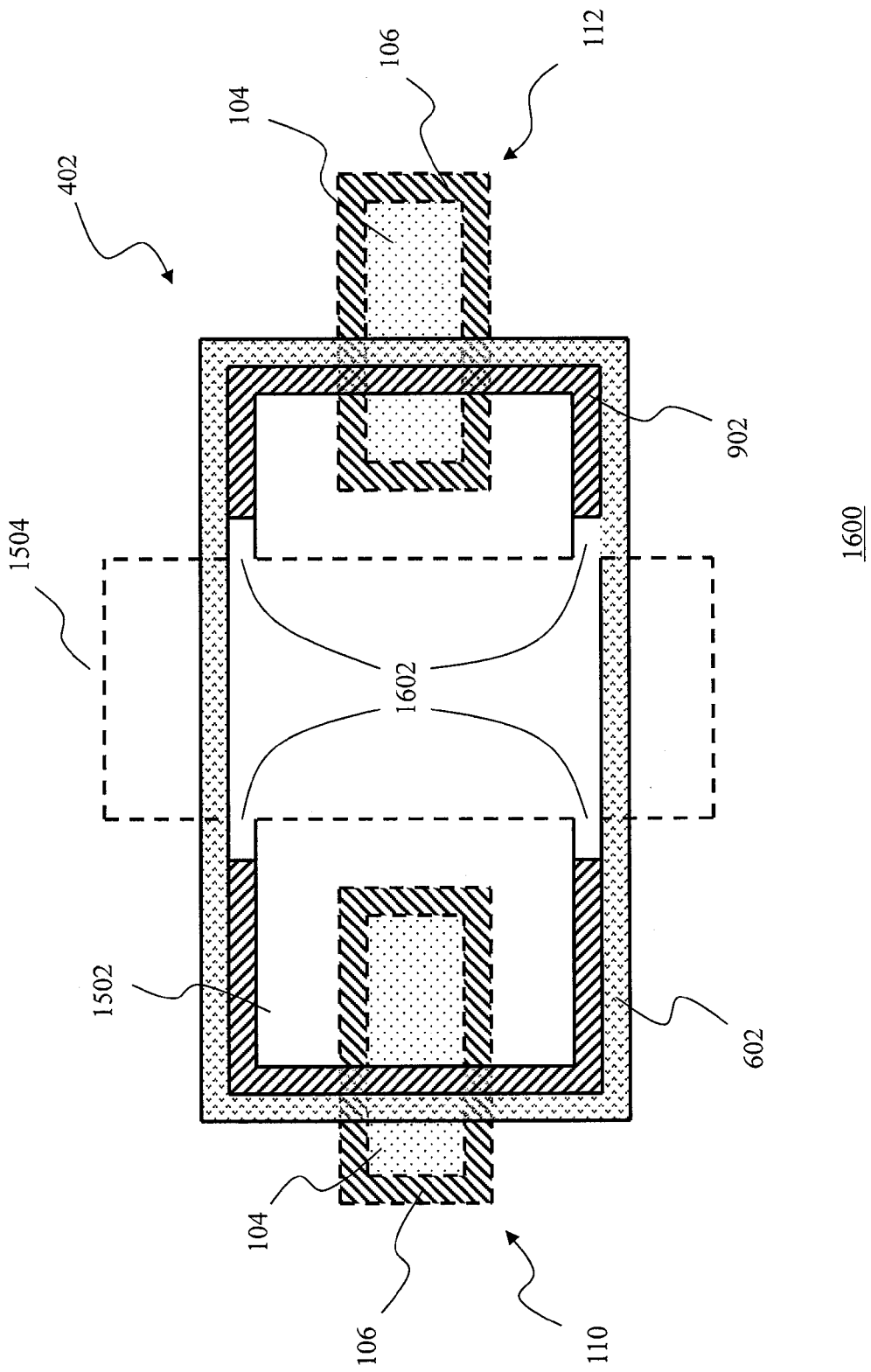
FIG. 16 is a follow-on view which illustrates the etched platinum BE spacers structure.

With reference additionally now to FIG. 16, the etching of the platinum around the sidewalls on the F-RAM opening structure 1500 is depicted to create etched platinum BE spacers structure 1600. In FIG. 16, using the pattern defined by the image opening 1504, the exposed surfaces around the sidewalls of the F-RAM opening 402 are wet etched away producing undercut regions 1602.

Figure 17:
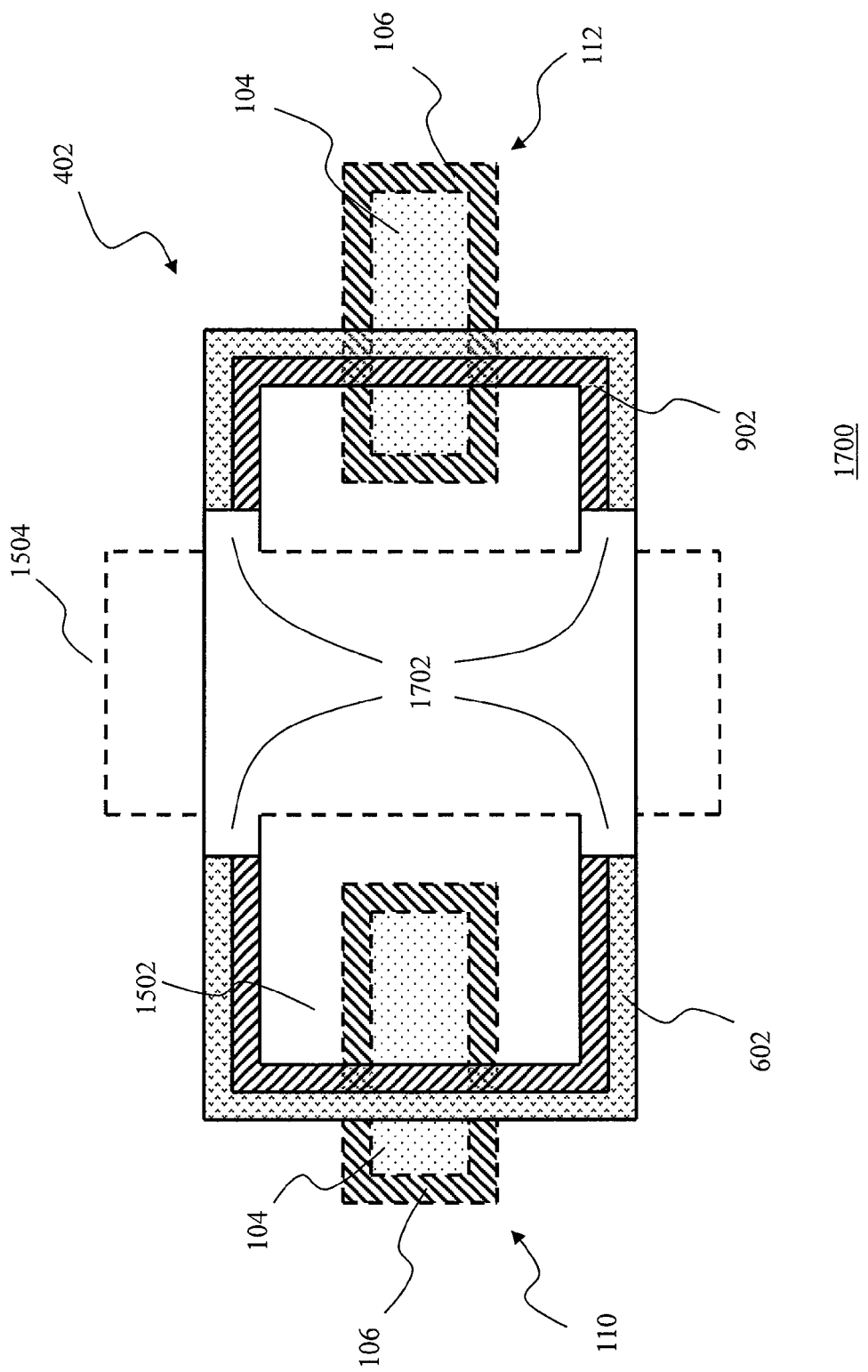
FIG. 17 is a follow-on view which illustrates the etched titanium aluminum nitride BE spacers structure.

With reference additionally now to FIG. 17, the etching of the titanium aluminum nitride on the etched platinum BE spacers structure 1600 is shown, forming etched titanium aluminum nitride spacers structure 1700 by which the sidewalls of platinum BE spacers 902 are removed. In FIG. 17, employing the same pattern defined by the image opening 1504, a portion of the titanium aluminum nitride spacers 602 around the sidewalls of the F-RAM opening 402 is isotropically etched away, forming over-etched regions 1702. Note that the titanium aluminum nitride spacers 602 are etched back to the same level as the platinum BE spacers 902.

Figure 18:
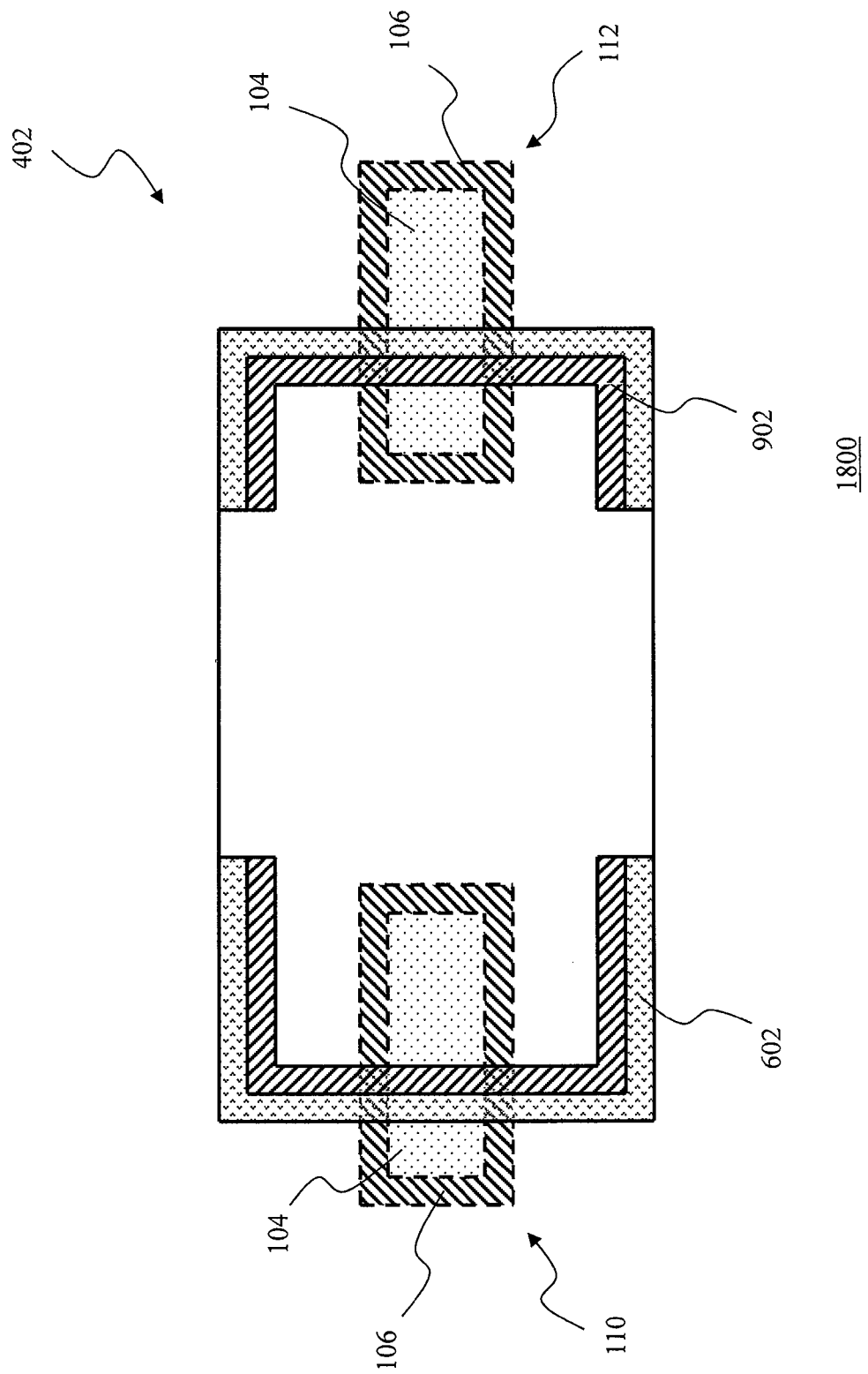
FIG. 18 is a follow-on view which illustrates the F-RAM opening structure after the etching of sidewalls.

With reference additionally now to FIG. 18, the removal of the photoresist material from the titanium aluminum nitride spacers structure 1700 is shown, creating F-RAM opening structure 1800. In FIG. 18, the remaining photoresist 1502 material is etched away using an $O_2$ plasma ash etching technique and removed with a vacuum pump.

Figure 19:
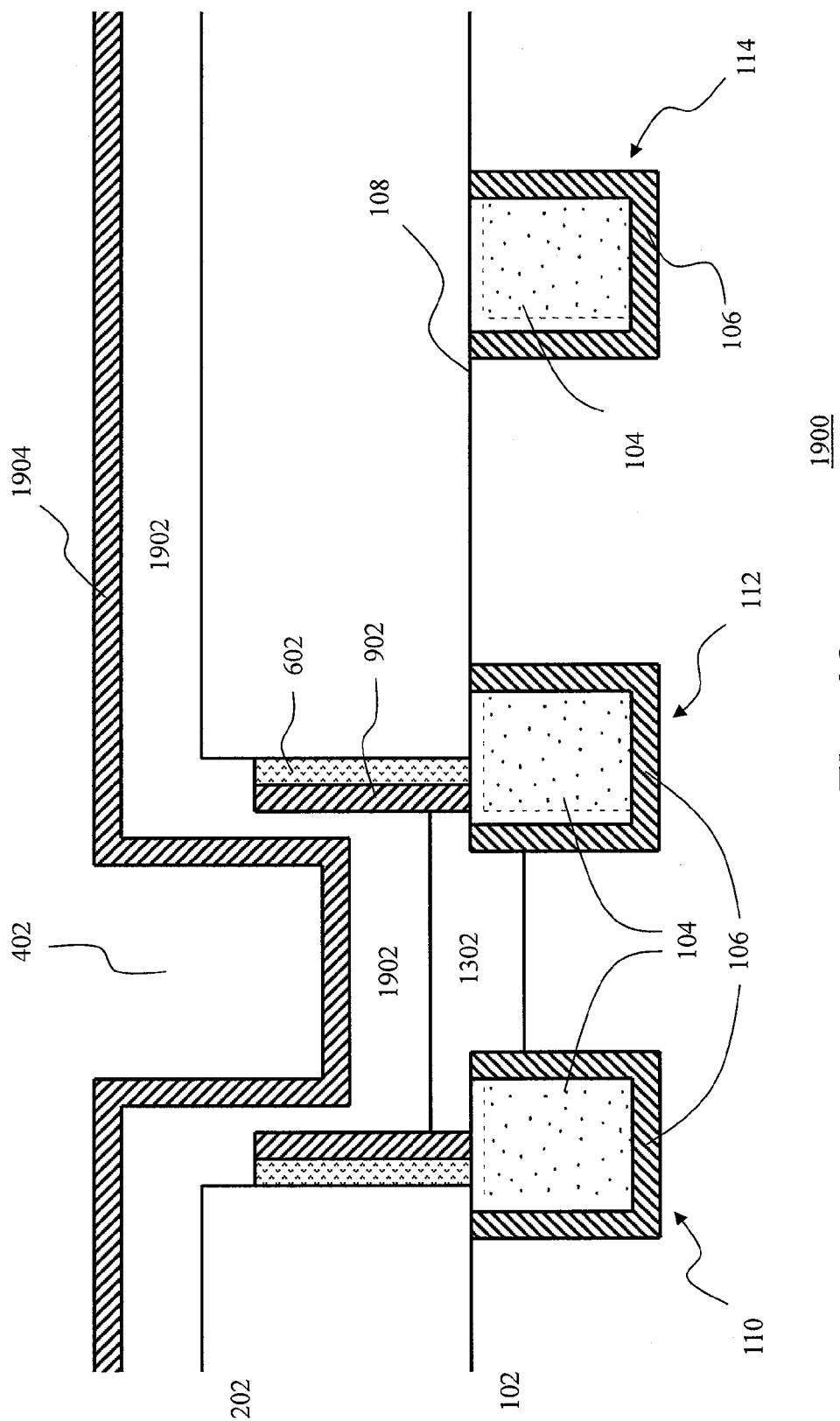
FIG. 19 is a partial cross-sectional view which illustrates the F-RAM PZT structure.

With reference additionally now to FIG. 19, a side view of representative process of the invention is again illustrated and shows the addition of a layer of ferroelectric material to the F-RAM structure 1800, creating F-RAM PZT structure 1900. In FIG. 19, a conformal ferroelectric layer of PZT 1902, which may be ideally doped with PZT (lead zirconium titanate), is CVD deposited and planarized on top of the trench cap 1302, the top of the oxide 202 layer and into the F-RAM opening 402 to a thickness of about 2000 to 3000 angstroms. The thickness of the PZT 1902 on the sidewalls adjoining the BE spacers 902 may be about 400 to 2000 angstroms. The PZT 1902 material is formed of lead (Pb), zirconium (Zr), and titanate (Ti) atoms, with an atomic ratio of the Zr atoms to the Ti atoms (Zr:Ti) of less than 2:3. While PZT 1902 is used as the ferroelectric layer, other known ferroelectric compounds such as strontium bismuth tantalate (SBT) may also be employed.

FIG. 19 also shows a platinum 1904 top electrode (TE) conformal layer that is subsequently deposited, using CVD, over the top of the PZT 1902 ferroelectric layer to a thickness of about 500 to 1000 angstroms. Other suitable materials for the top electrode (TE) layer include iridium (Ir) and iridium oxide (IrOx), palladium (Pd) and palladium oxide (PdOx), ruthenium (Ru) and ruthenium oxide (RuOx), rhodium (Rh) and rhodium oxide (RhOx) and other compatible noble metals.

Figure 20:
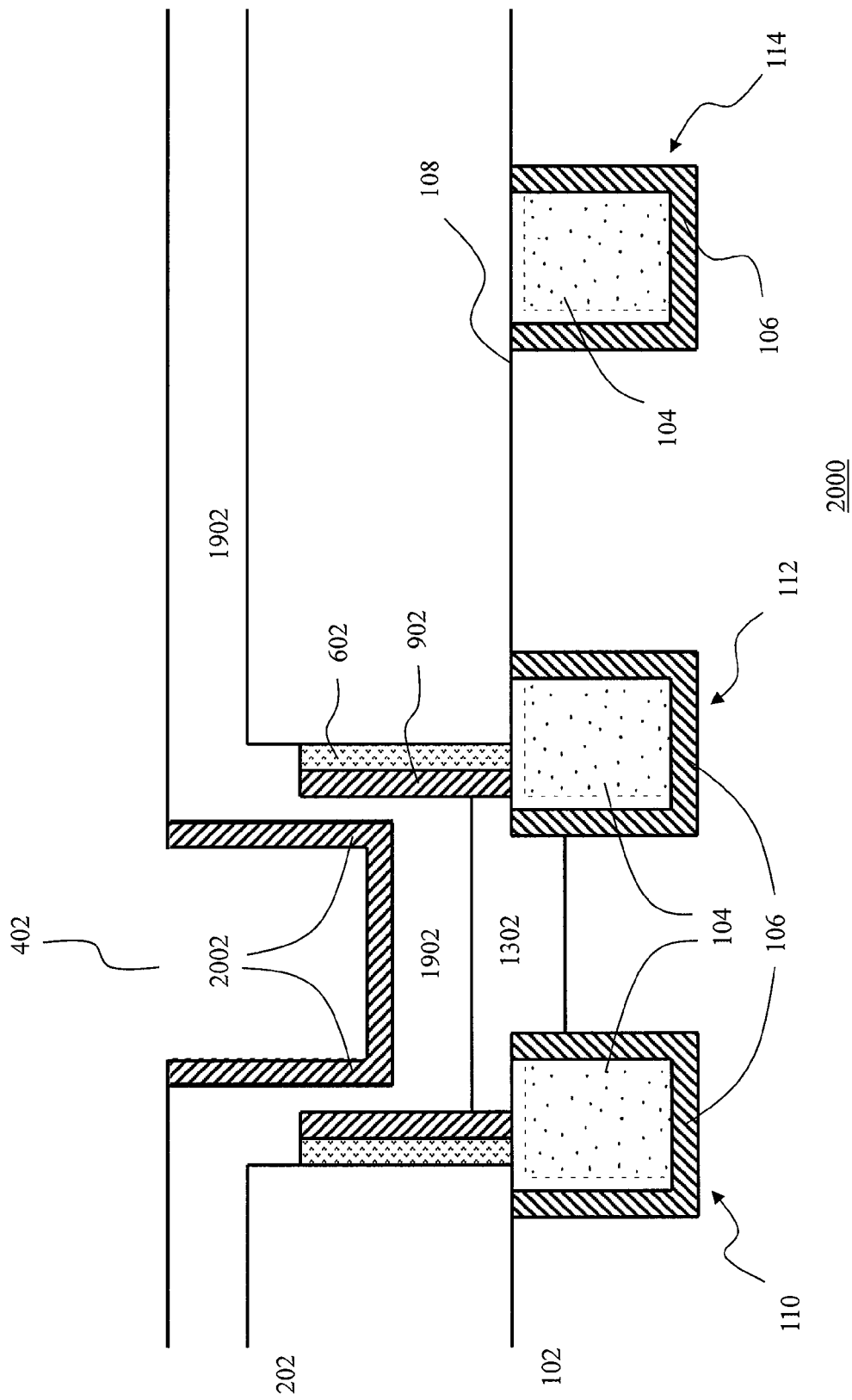
FIG. 20 is a follow-on view which illustrates the F-RAM structure with platinum TE spacers.

With reference additionally now to FIG. 20, the removal of a portion of the CVD platinum TE layer from the F-RAM PZT structure 1900, is shown forming F-RAM structure with platinum TE spacers 2000. In FIG. 20, the platinum 1904 (FIG. 19) TE conformal layer is etched away from the top of the PZT 1902 layer with a directional reactive-ion etch, forming a set of platinum TE spacers 2002. Note that in this step, the platinum 1904 layer remains only along the sides and bottom of the F-RAM opening 402.

Figure 21:
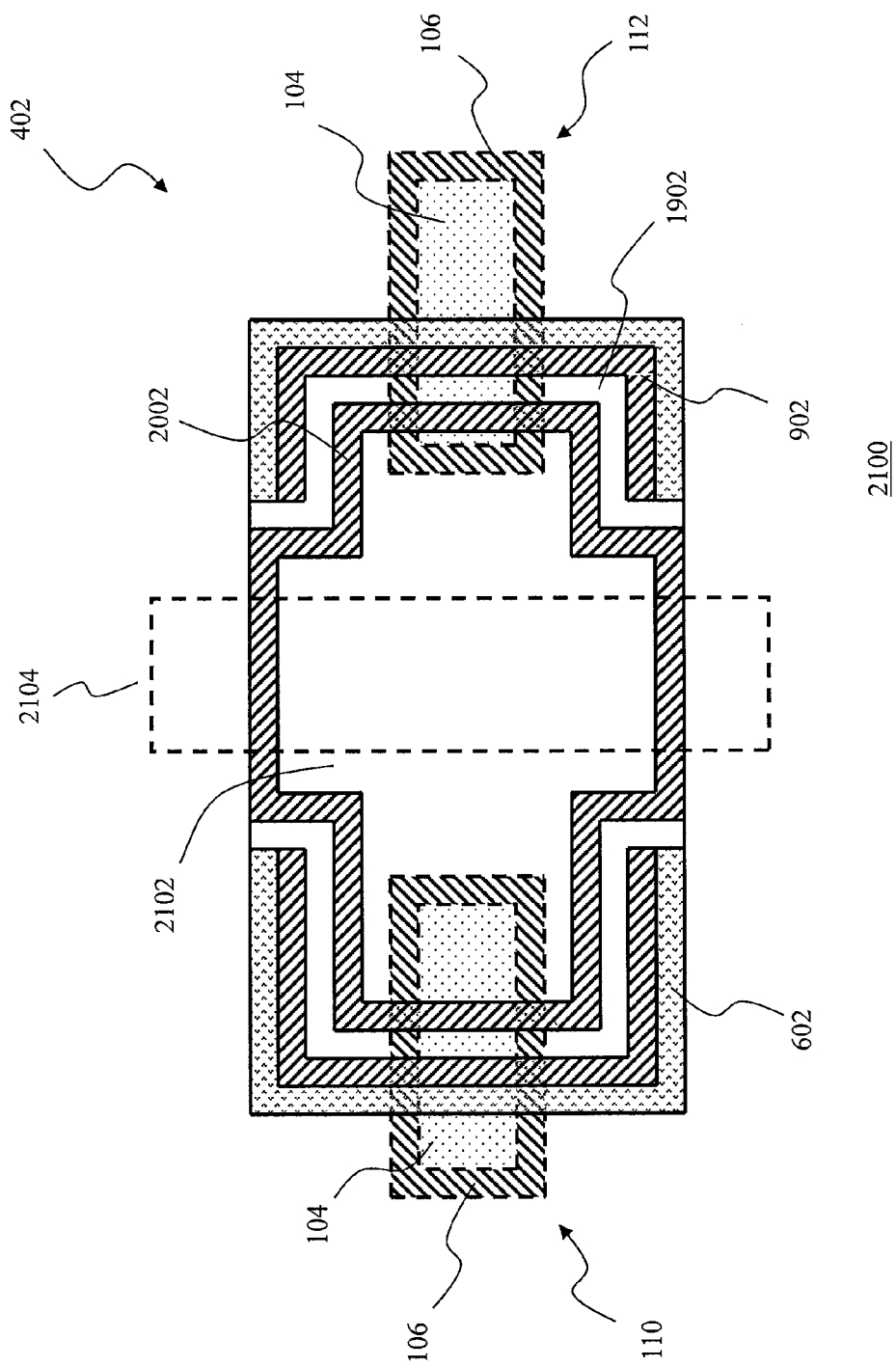
FIG. 21 is a partial top plan view which illustrates the F-RAM opening after the deposition of the PZT layer and top electrode layer.

With reference additionally now to FIG. 21, a top plan view of the invention is illustrated and depicts the F-RAM opening structure 2100. From a top view perspective, FIG. 21 shows the addition of the platinum TE spacers 2002 and the PZT 1902 ferroelectric layer around the F-RAM opening 402. FIG. 21 also shows the Ti/TiN 106 liners in contact stud A 110 and contact stud B 112, and the CVD tungsten 104 filling both contact stud A 110 and contact stud B 112. FIG. 21 shows the deposition, on top of the F-RAM opening 402 structure, of a photoresist 2102 material that is then imaged to form image opening 2104.

Figure 22:
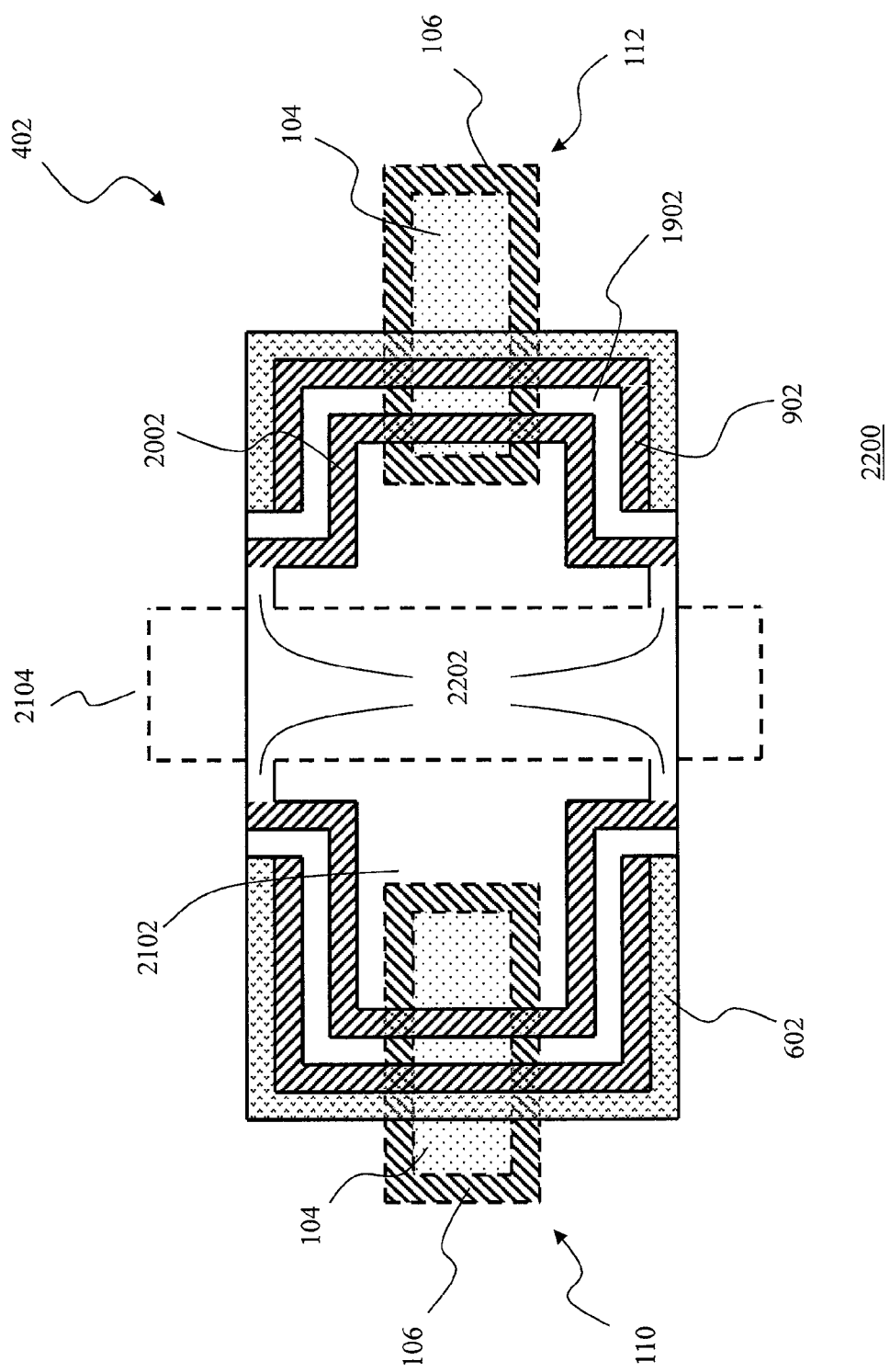
FIG. 22 is a follow-on view which illustrates the etched platinum TE spacers structure.

With reference additionally now to FIG. 22, the etching of the platinum TE spacers around the sidewalls on the F-RAM opening structure 2100 is depicted to create an etched platinum TE spacers structure 2200. In FIG. 22, using the pattern defined by the image opening 2104, a portion of the platinum TE spacers 2002 around the sidewalls of the F-RAM opening 402 is isotropically etched back, forming undercut regions 2202.

Figure 23:
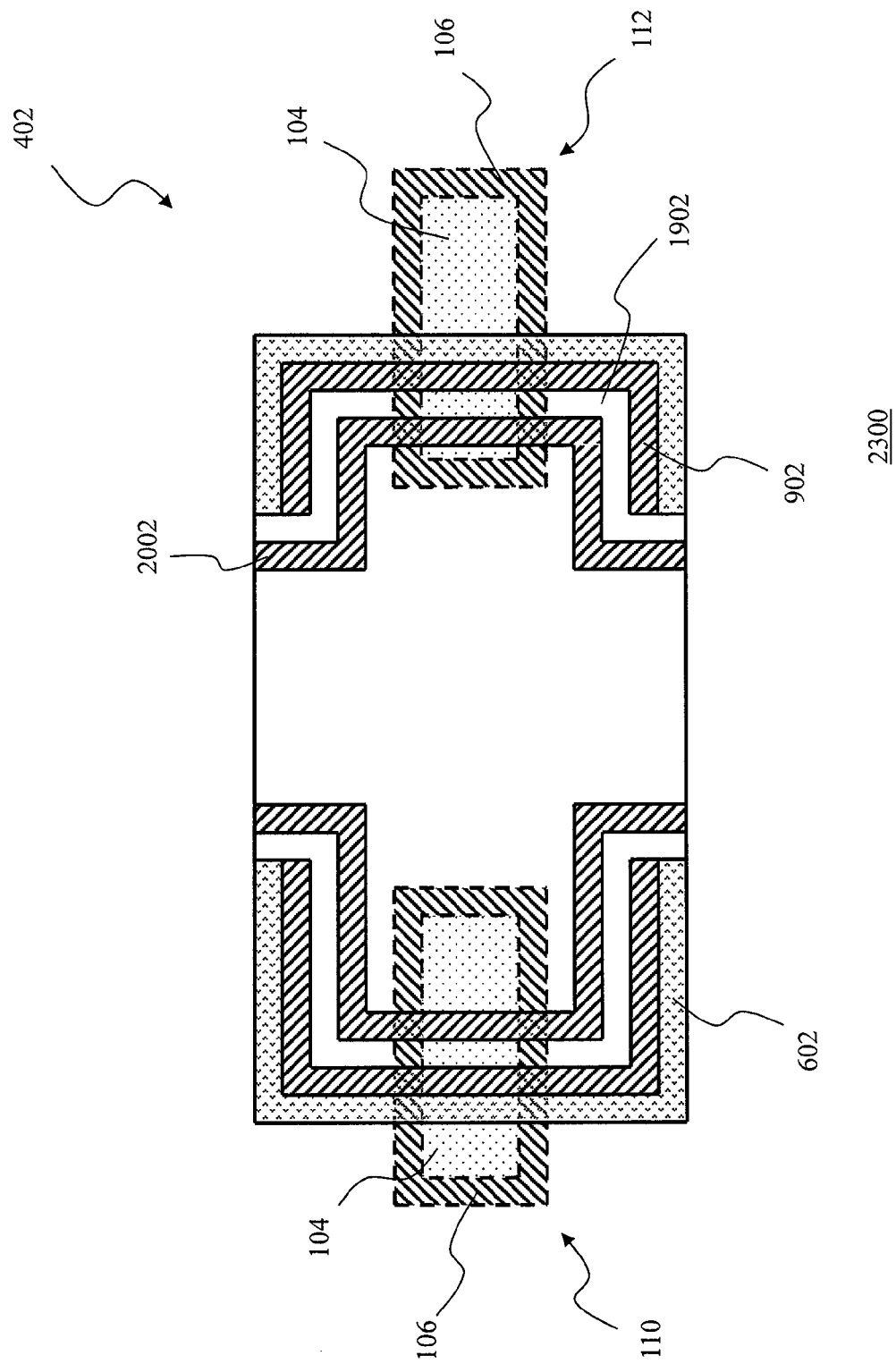
FIG. 23 is a follow-on view which illustrates the sidewall capacitor structure.

With reference additionally now to FIG. 23, the removal of the photoresist material from the etched platinum TE spacers structure 2200 is shown, creating sidewall capacitors structure 2300. In FIG. 23, just the remaining photoresist 2102 material is etched away using an $O_2$ plasma ash etching technique and removed with a vacuum pump. Note in FIG. 23, the PZT 1902 ferroelectric layer isolates the platinum TE spacers 2002 (top electrode) and the platinum BE spacers 902 (bottom electrode) to form two sidewall capacitor structures, one on each side of the F-RAM opening 402, and on top of contact stud A 110 and contact stud B 112.

Figure 24:
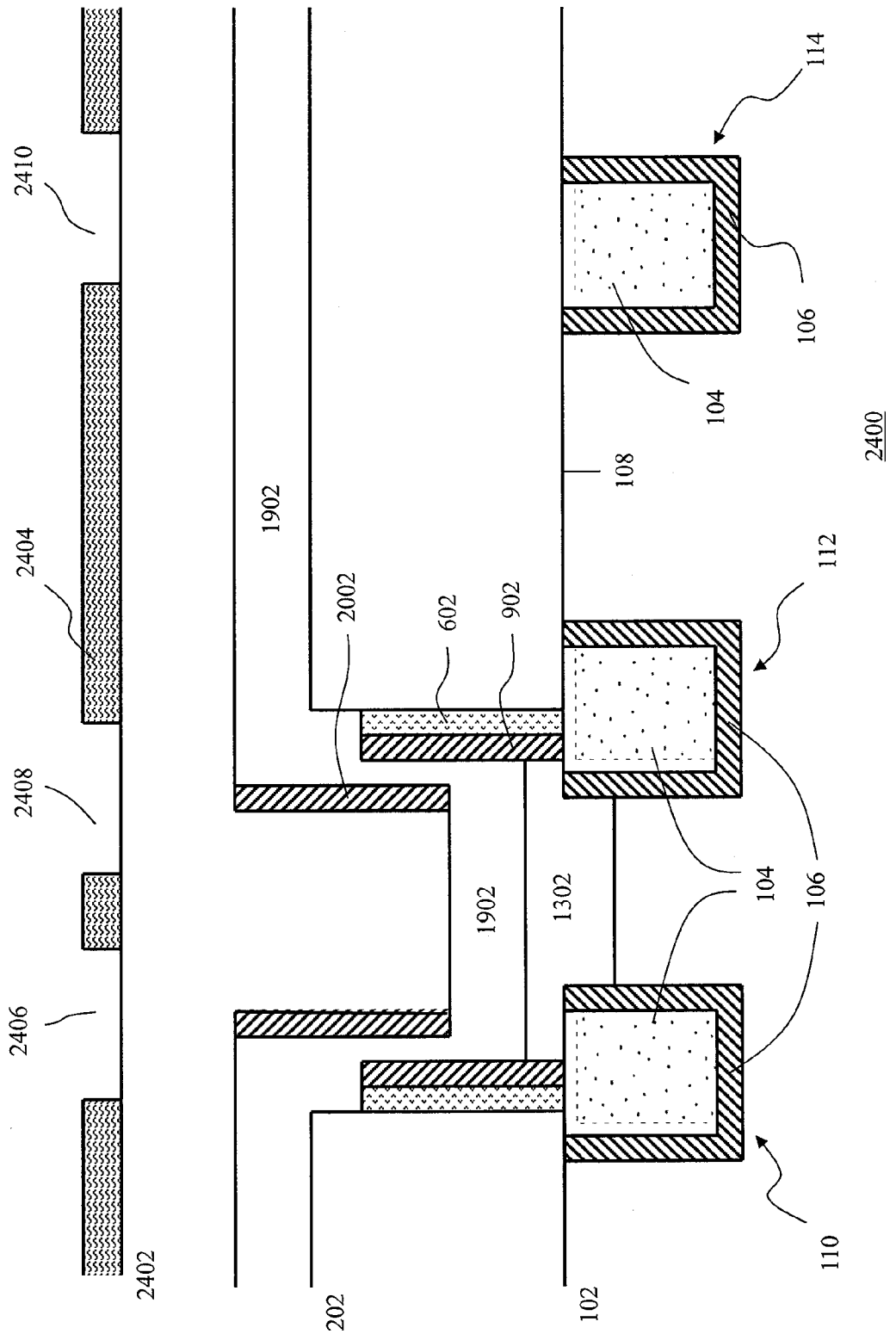
FIG. 24 is a partial cross-sectional view which illustrates the contact non-erodible mask structure.

With reference additionally now to FIG. 24, the application of a non-erodible mask over the sidewall capacitors structure 2300 is shown, forming the contact non-erodible mask structure 2400. An oxide 2402 layer is conformably deposited and planarized on top of the PZT 1902 ferroelectric layer and into the F-RAM opening 402. A non-erodible mask structure 2404 is subsequently defined using a photoresist which is imaged and etched to form opening J 2406, opening K 2408, and opening L 2410 in the non-erodible mask structure 2404, leaving exposed regions on the oxide 2402 layer. This non-erodible mask can be made of different materials such as aluminum oxide ($Al_2O_3$), silicon nitride ($Si_3N_4$), and other metals such as aluminum.

Figure 25:
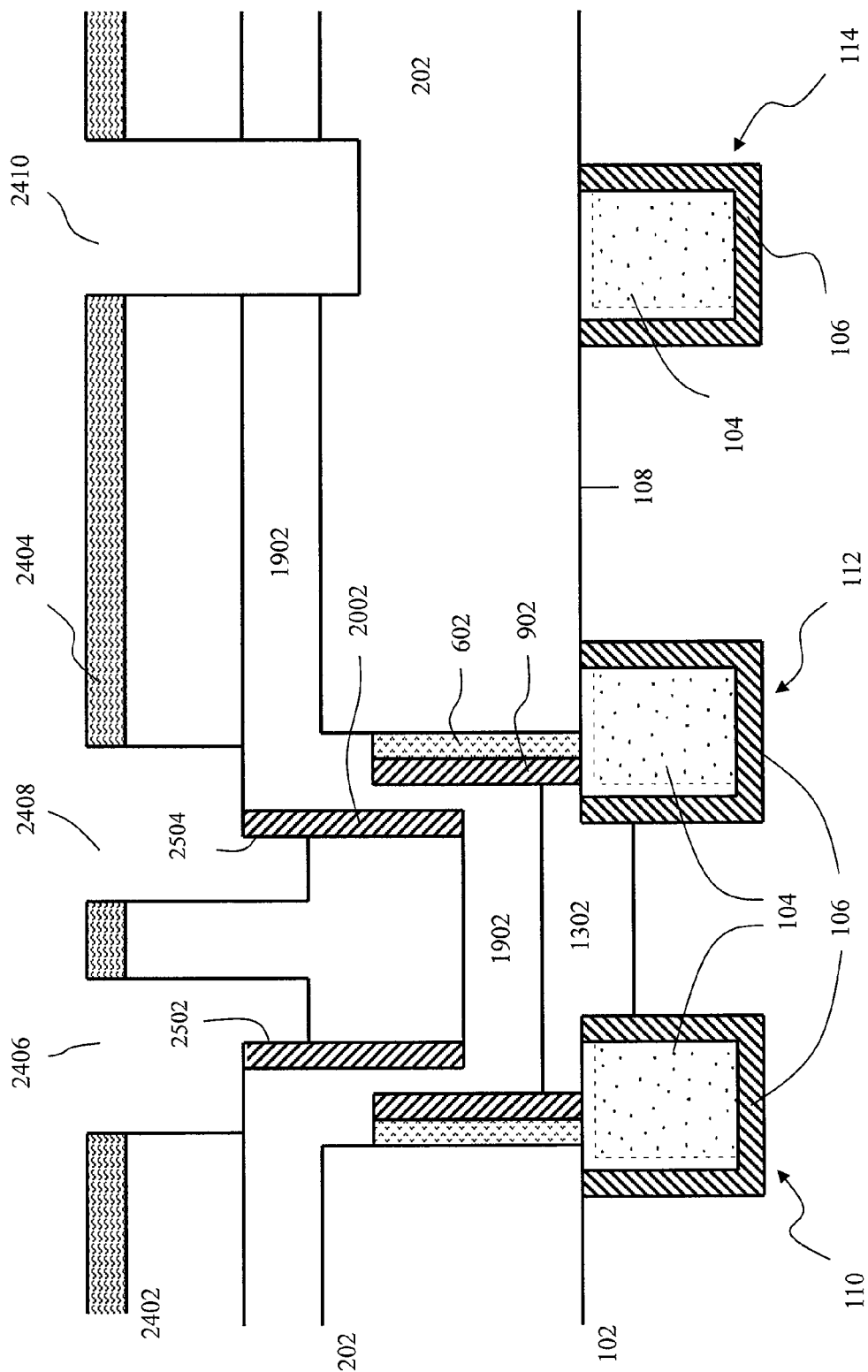
FIG. 25 is a follow-on view which illustrates the contact oxide etching structure.

With reference additionally now to FIG. 25, the etching of the oxide in the contact non-erodible mask structure 2400 is shown, creating the contact oxide etching structure 2500. In accordance with the non-erodible mask 2404 pattern, the exposed regions of oxide 2402 layer in the opening J 2406 and opening K 2408 are etched down below the level of the PZT 1902 ferroelectric layer using $CF_4$ in oxygen, creating TE contact region A 2502 (top electrode) and TE contact region B 2504 (top electrode). Note that in this process step, etching is also performed on the opening L 2410 through the PZT 1902 ferroelectric layer and down into a portion of the oxide 202 layer.

Figure 26:
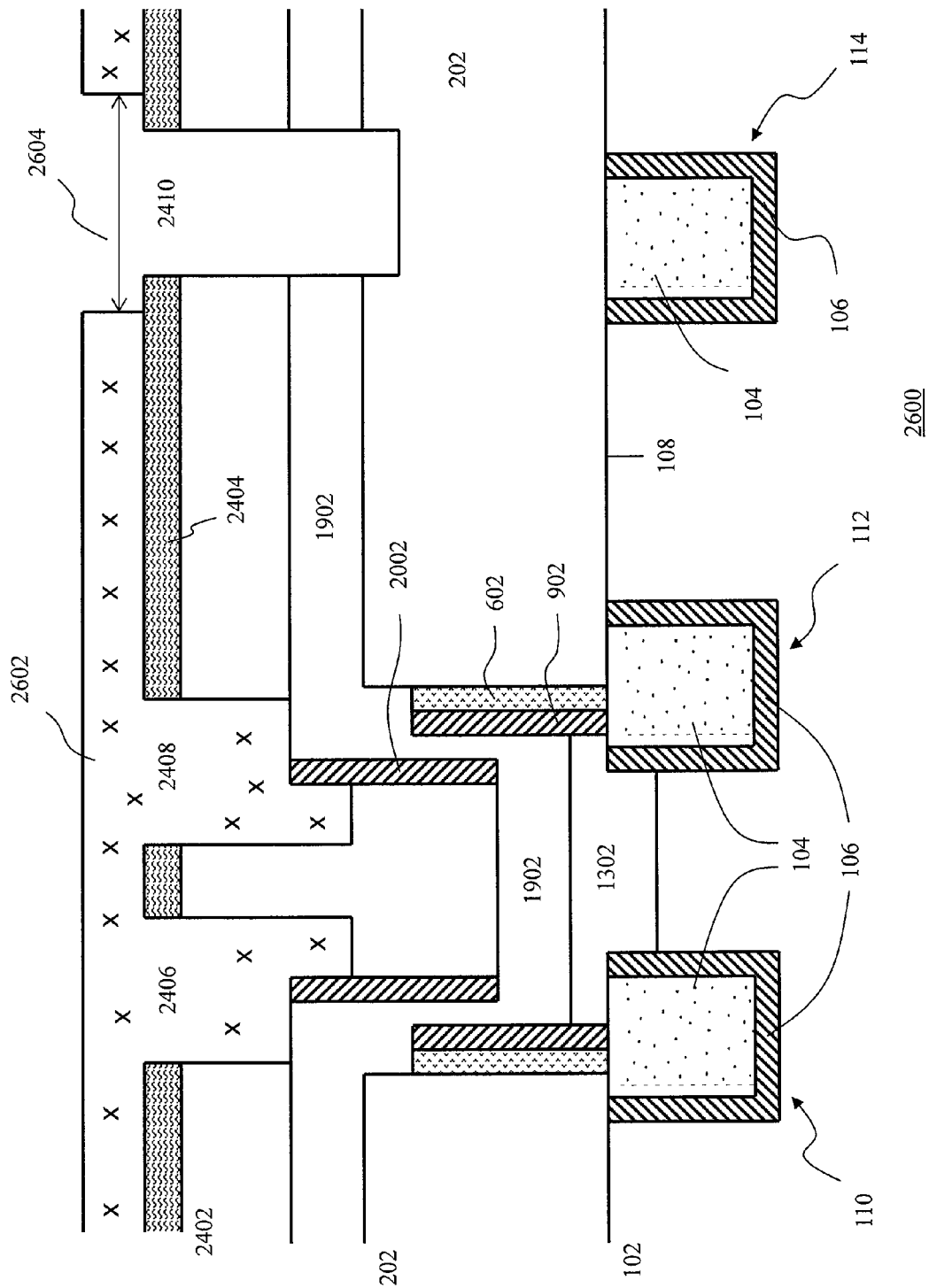
FIG. 26 is a follow-on view which illustrates the photoresist mask structure.

With reference additionally now to FIG. 26, the application of a photoresist mask over the contact etched structure 2500 is shown, creating photoresist mask structure 2600. In FIG. 26, a photoresist mask 2602 is deposited over the contact oxide etched structure 2500 and then imaged and developed to form an open region X 2604 which is somewhat larger than the opening L 2410. Note that in this step, the photoresist mask 2602 covers opening J 2406 and opening K 2408.

Figure 27:
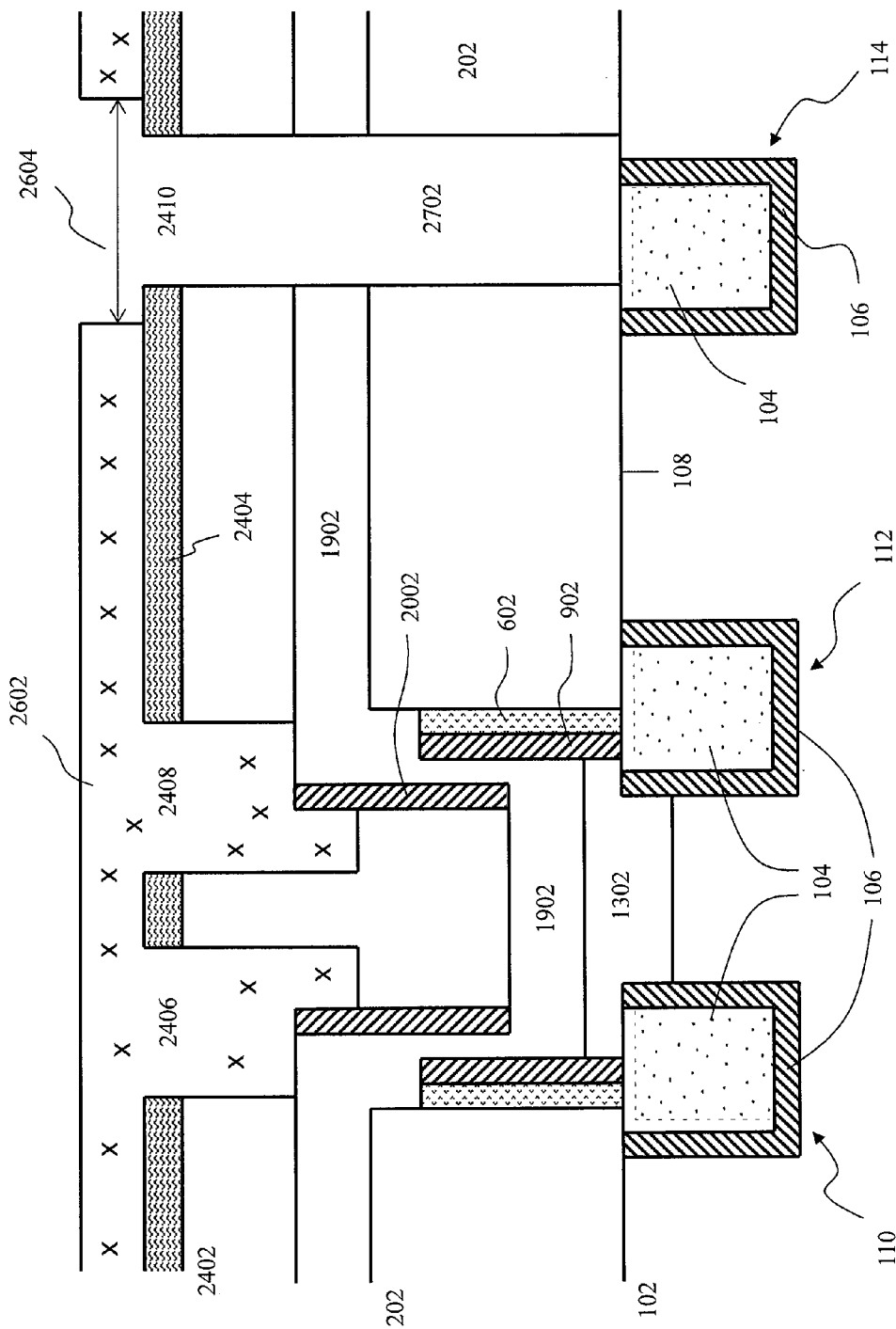
FIG. 27 is a follow-on view which illustrates the etched oxide structure.

With reference additionally now to FIG. 27, the etching of the exposed oxide in the photoresist mask structure 2600 is shown, forming etched oxide structure 2700. According to the pattern created by the photoresist mask 2602, the oxide 202 material is etched completely down to the contact stud C 114. This oxide 202 material can be removed using a reactive-ion process. This step creates contact hole Y 2702 and leaves contact stud C 114 exposed.

Figure 28:
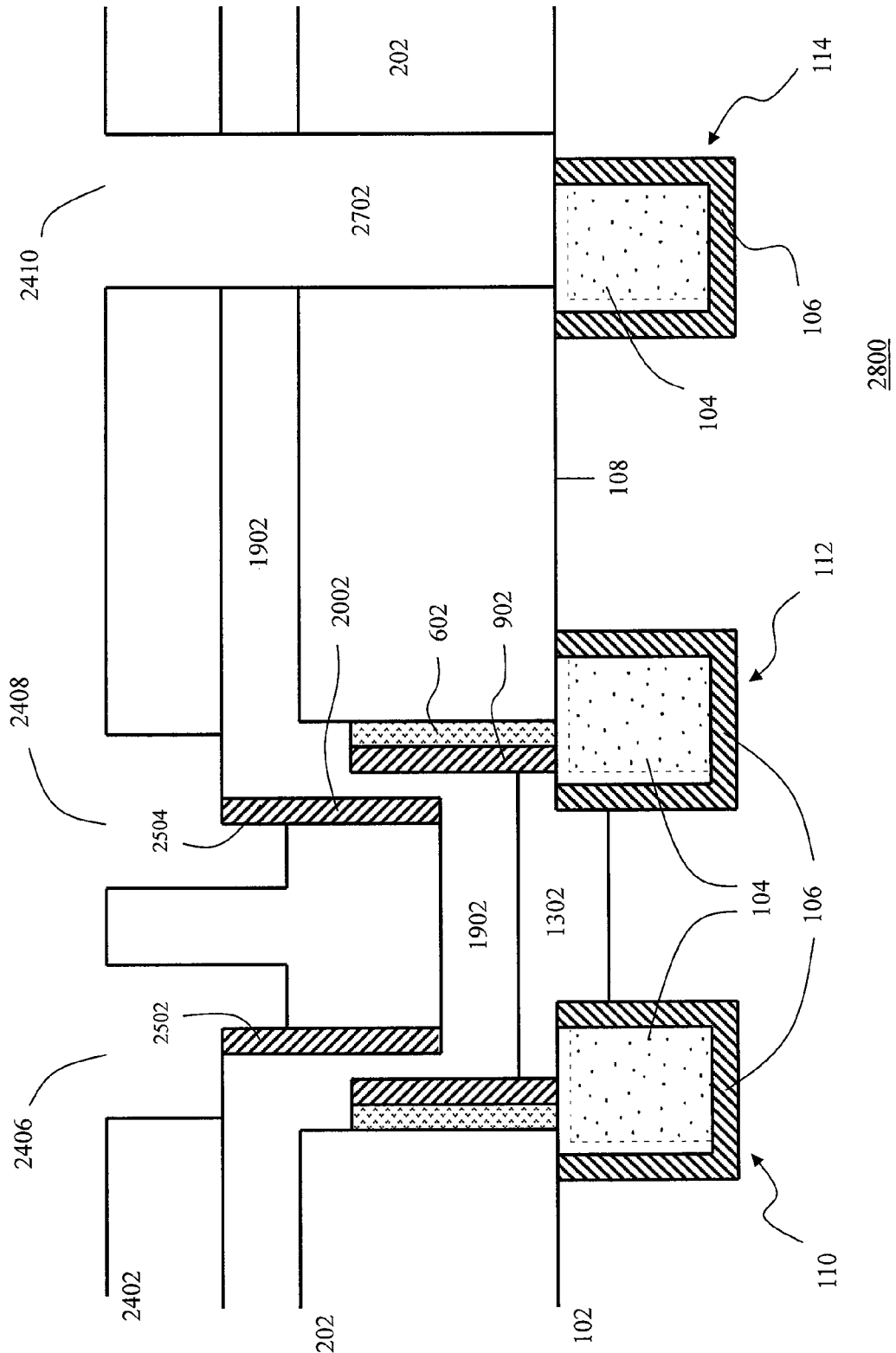
FIG. 28 is a follow-on view which illustrates the F-RAM contact opening structure.

With reference additionally now to FIG. 28, the removal of the photoresist mask in the etched oxide structure 2700 is illustrated, forming F-RAM contact opening structure 2800. In FIG. 28, the photoresist mask 2602 is removed using the same $O_2$ plasma ash etching technique used in prior steps. Additionally, in FIG. 28, the non-erodible mask pattern 2404 is subsequently removed employing an ion etch chemistry, specific to the type of materials used in the non-erodible mask itself. For example, if the non-erodible mask is made of $Si_3N_4$, it may be etched by a $Si_3N_4$ reactive-ion etch that will not affect the oxide 2402 layer, the Ti/TiN 106 or the CVD tungsten 104 that are exposed to the etching reactive agent. This step leaves opening J 2406, opening K 2408, and opening L 2410 uncovered.

Figure 29:
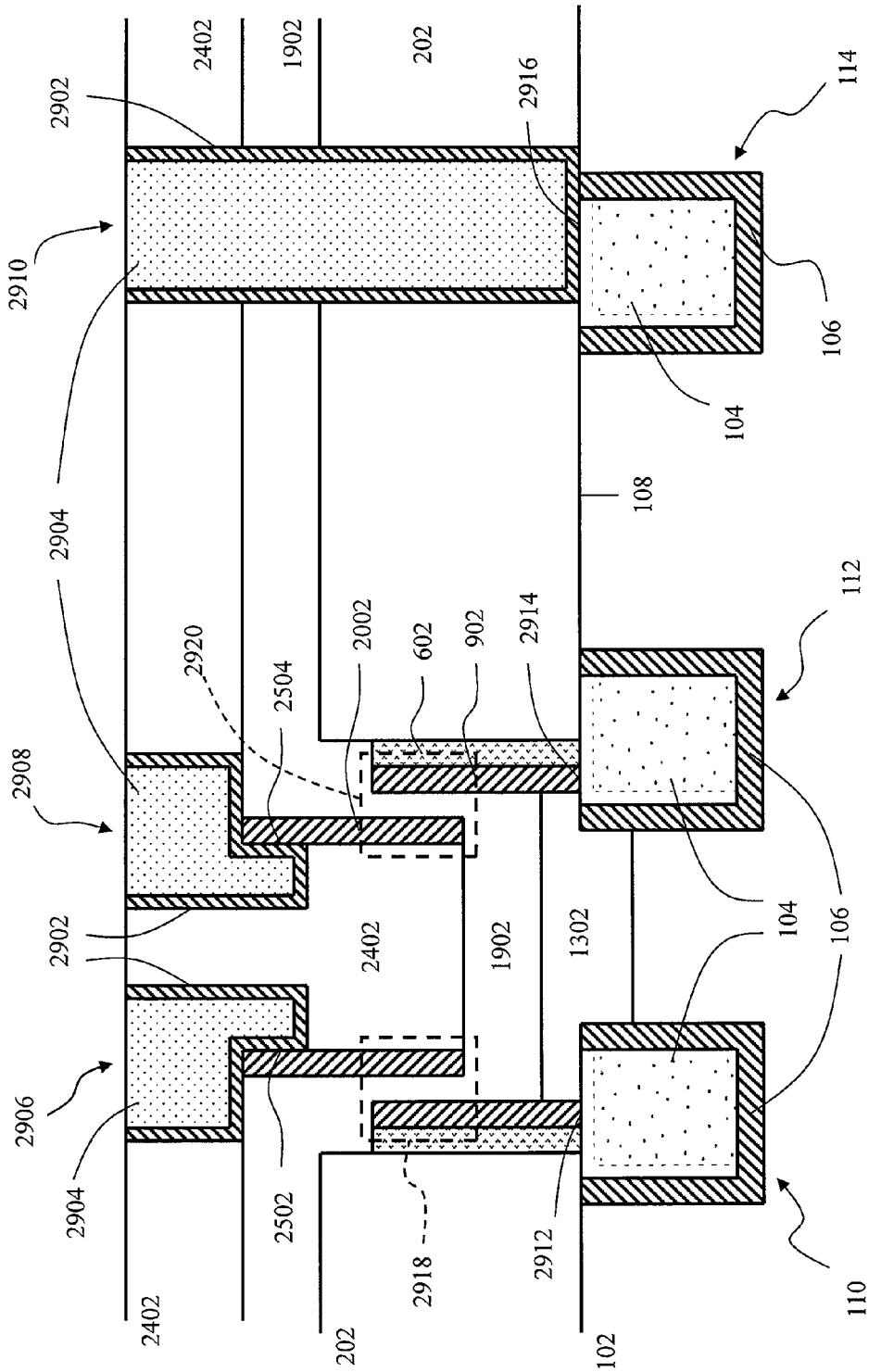
FIG. 29 is a follow-on view which illustrates the final F-RAM contact stud structure.

With reference additionally now to FIG. 29, the formation of contact studs in the F-RAM contact opening structure 2800 is illustrated, creating the final F-RAM contact stud structure 2900. The last process steps are illustrated in FIG. 29. Ti/TiN 2902 liners are deposited into opening J 2406, opening K 2408, and opening L 2410 followed by an application of a CVD tungsten 2904 layer over the entire surface of F-RAM contact stud structure 2900, followed by a CMP process to polish back and planarize the CVD tungsten 2904 back to the level of the oxide 2402 layer.

As a result, three new contact studs (contact stud J 2906, contact stud K 2908 and contact stud L 2910) are formed of Ti/TiN and CVD tungsten and this last step forms the contacts for each of the sidewall capacitors. Note in FIG. 29, sidewall capacitor 1 2918 (dotted section on the left of the F-RAM opening 402) couples the top electrode with contact stud J 2906 via TE contact region A 2502, and couples the bottom electrode of the sidewall capacitor with contact stud A 110 through the BE contact region A 2912. Similarly, sidewall capacitor 2 2920 (dotted section on the right of the F-RAM opening 402) couples the top electrode with contact stud K 2908 through the TE contact region B 2504, and couples the bottom electrode of the sidewall capacitor with contact stud B 112 via BE contact region B 2914. Notice too that the PZT 1902 layer is common to both sidewall capacitors, in terms of the structures, but the top electrodes and bottom electrodes are isolated from each other. Also in FIG. 29, contact stud L 2910 (third formed contact stud) is coupled to contact stud C 114 through contact region 2916.

Figure 30:
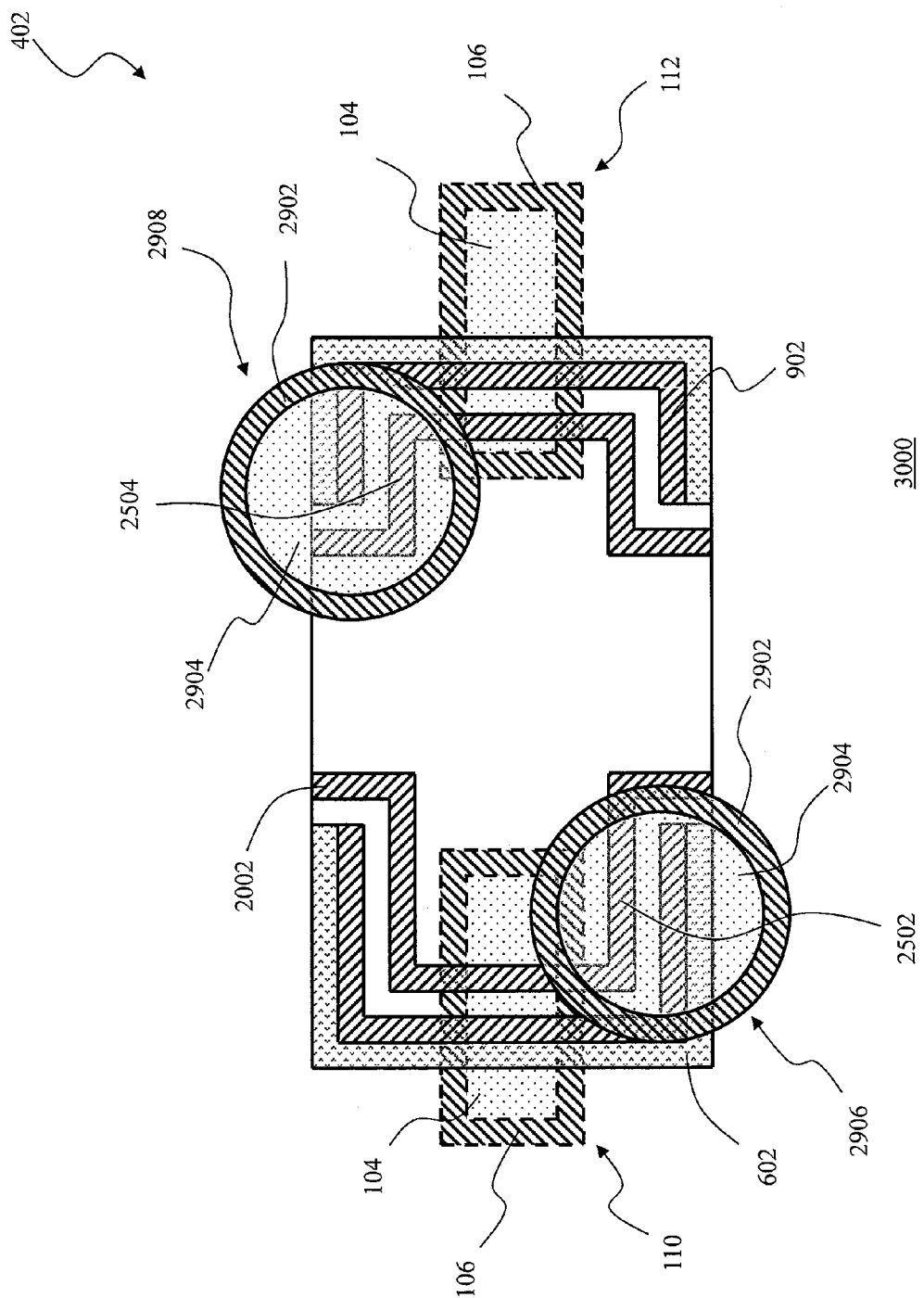
FIG. 30 is a partial top plan view which illustrates the final F-RAM contact stud structure.

With reference additionally now to FIG. 30, a top plan view of the F-RAM final contact stud structure 3000 is shown. From a top view perspective, FIG. 30 illustrates (as circles) both contact stud J 2906 and contact stud K 2908 formed of Ti/TiN 2902 liners and filled by CVD tungsten 2904 at both sides of the F-RAM opening 402. The TE contact region A 2502 (top electrode) couples with top contact stud J 2906, while TE contact region B 2504 (top electrode) couples with top contact stud K 2908.

While there have been described above the principles of the present invention in conjunction with specific processing steps and device structure, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

As used herein, the terms "comprises", "comprising", or any other variation thereof, are intended to cover a non-exclusive inclusion, such that a process, method, article, or apparatus that comprises a recitation of certain elements does not necessarily include only those elements but may include other elements not expressly recited or inherent to such process, method, article or apparatus. None of the description in the present application should be read as implying that any particular element, step, or function is an essential element which must be included in the claim scope and THE SCOPE OF THE PATENTED SUBJECT MATTER IS DEFINED ONLY BY THE CLAIMS AS ALLOWED. Moreover, none of the appended claims are intended to invoke paragraph six of 35 U.S.C. Sect. 112 unless the exact phrase "means for" is employed and is followed by a participle.

What is claimed is:

1. A method for forming a semiconductor device on a substrate having at least two contact studs formed in a planar surface thereof, the method comprising:
    forming an insulating layer overlying said planar surface;
    selectively removing a portion of said insulating layer and a selected portion of said planar surface to form an opening extending to and partially between said at least two contact studs;
    forming first spacers adjoining sides of said opening over said at least two contact studs;
    forming bottom electrode spacers, each contacting respective ones of said at least two contact studs in said opening adjoining said first spacers;
    forming an insulating cap in said opening between said at least two contact studs and said bottom electrode spacers;
    forming a ferroelectric dielectric layer in said opening over said insulating layer, said insulating cap and between said bottom electrode spacers;
    forming a pair of top electrodes within said opening comprising first and second side portions displaced laterally from respective ones of said bottom electrode spacers by said ferroelectric dielectric layer;
    forming an additional insulating layer between said top electrodes and over said ferroelectric dielectric layer; and
    forming first and second contacts to respective ones of said pair of top electrodes within said additional insulating layer.

2. The method of claim 1 wherein said step of forming an insulating layer comprises:
    depositing oxide on said planar surface.

3. The method of claim 1 wherein said step of selectively removing a portion of said insulating layer and a selected portion of said planar surface comprises:
    patterning a mask on said insulating layer; and
    etching said insulating layer and said selected portion of said planar surface in areas defined by said mask.

4. The method of claim 3 wherein said mask comprises one of $Al_2O_3$ or $Si_3N_4$.

5. The method of claim 3 wherein said step of etching comprises reactive ion etching.

6. The method of claim 1 wherein said step of forming first spacers comprises:
    depositing a layer of titanium aluminum nitride in said opening; and
    removing said titanium aluminum nitride except for sidewalls of said opening.

7. The method of claim 6 wherein said step of forming bottom electrode spacers comprises:
    depositing a bottom electrode layer comprising at least one of Pt, Ir, IrOx, Pd, PdOx, Ru, RuOx, Rh, RhOx or other noble metal on said titanium aluminum nitride in said opening; and removing said bottom electrode layer except for portions adjoining said first spacers.

8. The method of claim 1 wherein said step of forming an insulating cap comprises:
depositing an oxide layer in said opening between said first and bottom electrode spacers; and
removing said oxide layer except for a lower portion of said opening.

9. The method of claim 1 wherein said step of forming a ferroelectric dielectric layer comprises:
depositing a ferroelectric material comprising at least one of PZT, PLZT, BST, SBT or STO.

10. The method of claim 1 wherein said step of forming said pair of top electrodes comprises:
depositing a top electrode layer comprising at least one of Pt, Ir, IrOx, Pd, PdOx, Ru, RuOx, Rh, RhOx or other noble metal over said ferroelectric dielectric layer; and
removing said top electrode layer except for portions aligned with sidewalls of said opening and displaced from said bottom electrode spacers by said ferroelectric dielectric layer.

11. The method of claim 1 wherein said step of forming an additional insulating layer comprises:
depositing an oxide between said top electrodes and over said ferroelectric dielectric layer.

12. The method of claim 11 further comprising:
planarizing said oxide.

13. The method of claim 12 wherein said step of planarizing comprises CMP.

14. The method of claim 1 wherein said step of forming first and second contacts to said top electrode comprises:
selectively etching said additional insulating layer in a pattern defined by a photoresist mask to produce first and second contact openings; and
producing a contact in each of said first and second contact openings.

15. The method of claim 14 wherein said step of producing said contact comprises:
depositing Ti/TiN liners in said first and second contact openings; and
depositing W in said Ti/TiN liners.

16. The method of claim 1 further comprising:
planarizing said first and second contacts to a level of said additional insulating layer.

17. The method of claim 16 wherein said step of planarizing comprises CMP.

18. A method for forming a ferroelectric device comprising:
forming first and second contact studs in a planar surface of a substrate;
depositing an oxide layer on said planar surface;
selectively etching said oxide layer to form an opening through said oxide layer to said first and second contact studs and an over-etched region therebetween;
depositing a titanium aluminum nitride layer over said oxide layer and within said opening and over-etched region;
selectively removing portions of said titanium aluminum nitride layer except for sidewalls of said opening adjoining said first and second contact studs to produce first spacers;
depositing a noble metal layer within said opening;
selectively removing said noble metal layer over said first and second contact studs and within said over-etched region to produce bottom electrode spacers medially of said first spacers;
depositing an additional oxide layer within said opening;
selectively removing said additional oxide layer to produce a trench cap in a lower portion of said opening and within said over-etched region;
depositing a ferroelectric dielectric layer over said oxide layer, said trench cap and medial and distal portions of said first and bottom electrode spacers within said opening;
depositing an additional noble metal layer over said ferroelectric dielectric layer;
selectively removing said additional noble metal layer to form a pair of top electrodes within said opening displaced from said bottom electrode spacers by said ferroelectric dielectric layer;
depositing a further oxide layer over said ferroelectric dielectric layer and between said pair of top electrodes;
selectively etching said further oxide layer to form first and second openings to corresponding first and second ones of said top electrodes; and
forming electrical contacts to said first and second ones of said top electrodes through said first and second openings.

19. The method of claim 18 wherein said step of selectively etching said oxide layer comprises:
patterning a mask on said oxide layer; and
etching said oxide layer and said planar surface between said first and second contact studs to produce said opening and said over-etched region.

20. The method of claim 19 wherein said mask comprises $Al_2O_3$ or $Si_3N_4$.

21. The method of claim 19 wherein said step of etching said oxide layer comprises reactive ion etching.

22. The method of claim 18 wherein said step of depositing a noble metal layer comprises:
depositing at least one of Pt, Ir, IrOx, Pd, PdOx, Ru, RuOx, Rh, RhOx or other noble metal in said opening.

23. The method of claim 18 wherein said step of depositing a ferroelectric dielectric layer comprises:
depositing at least one of PZT, PLZT, BST, SBT or STO.

24. The method of claim 18 wherein said step of depositing an additional noble metal layer comprises:
depositing at least one of Pt, Ir, IrOx, Pd, PdOx, Ru, RuOx, Rh, RhOx or other noble metal over said ferroelectric dielectric layer.

25. The method of claim 18 wherein said step of depositing an additional oxide layer further comprises:
planarizing said additional oxide layer.

26. The method of claim 18 wherein said step of selectively etching said additional oxide layer comprises:
selectively etching said additional oxide layer in a pattern defined by a photoresist mask to produce said first and second openings.

27. The method of claim 18 wherein said step of forming electrical contacts comprises:
depositing Ti/TiN liners in said first and second openings; and
depositing W in said Ti/TiN liners.

28. The method of claim 18 further comprising:
planarizing said electrical contacts to a level of said additional oxide layer.

29. The method of claim 28 wherein said step of planarizing comprises a CMP operation.

30. The method of claim 18 further comprising:
additionally forming an electrical contact to a third contact stud in said planar surface of said substrate through a third opening through said additional oxide layer, said ferroelectric dielectric layer and said oxide layer substantially concurrently with said step of forming said electrical contacts to said first and second ones of said top electrodes.

* * * * *